United States Patent [19]
Miura et al.

[11] Patent Number: 5,949,268
[45] Date of Patent: Sep. 7, 1999

[54] VARIABLE DELAY CIRCUIT FOR VARYING DELAY TIME AND PULSE WIDTH

[75] Inventors: Manabu Miura; Makoto Hatakenaka, both of Tokyo, Japan

[73] Assignee: Misubishi Denki Kabushiki Kaisha, Tokyo, Japan

[21] Appl. No.: 08/914,803

[22] Filed: Aug. 15, 1997

[30] Foreign Application Priority Data

Apr. 14, 1997 [JP] Japan .................................. 9-095841

[51] Int. Cl.⁶ ...................... H03K 5/13; H03K 17/687
[52] U.S. Cl. ........................ 327/278; 327/281; 327/288
[58] Field of Search ................................. 327/261, 269, 327/270, 272, 276–278, 281, 284, 285, 288; 365/233, 201

[56] References Cited

U.S. PATENT DOCUMENTS

| | | | |
|---|---|---|---|
| 5,111,085 | 5/1992 | Stewart | 327/278 |
| 5,128,567 | 7/1992 | Tanaka et al. | 307/572 |
| 5,327,031 | 7/1994 | Marbot et al. | 327/281 |
| 5,440,260 | 8/1995 | Hayashi et al. | 327/278 |
| 5,491,673 | 2/1996 | Okayasu | 327/158 |

FOREIGN PATENT DOCUMENTS 63-9220  1/1988  Japan .

*Primary Examiner*—Tim Callahan
*Assistant Examiner*—Eunja Shin
*Attorney, Agent, or Firm*—Leydig, Voit & Mayer, Ltd.

[57] ABSTRACT

A variable delay circuit for controlling delay time includes P channel transistors connected in parallel, with respective source electrodes connected to a power supply, respective drain electrodes connected to an output terminal for providing delayed signal, and respective gate electrodes connected to respective control signal input terminals for receiving control signals. The circuit further includes N channel transistors with respective source electrodes connected to ground, respective drain electrodes connected to the output terminal, and respective gate electrode connected to the respective control signal input terminals. Identical or mutually inverted data signals or control signals are supplied to the respective gate electrodes of the P channel transistors and the respective gate electrodes of the N channel transistors.

17 Claims, 26 Drawing Sheets

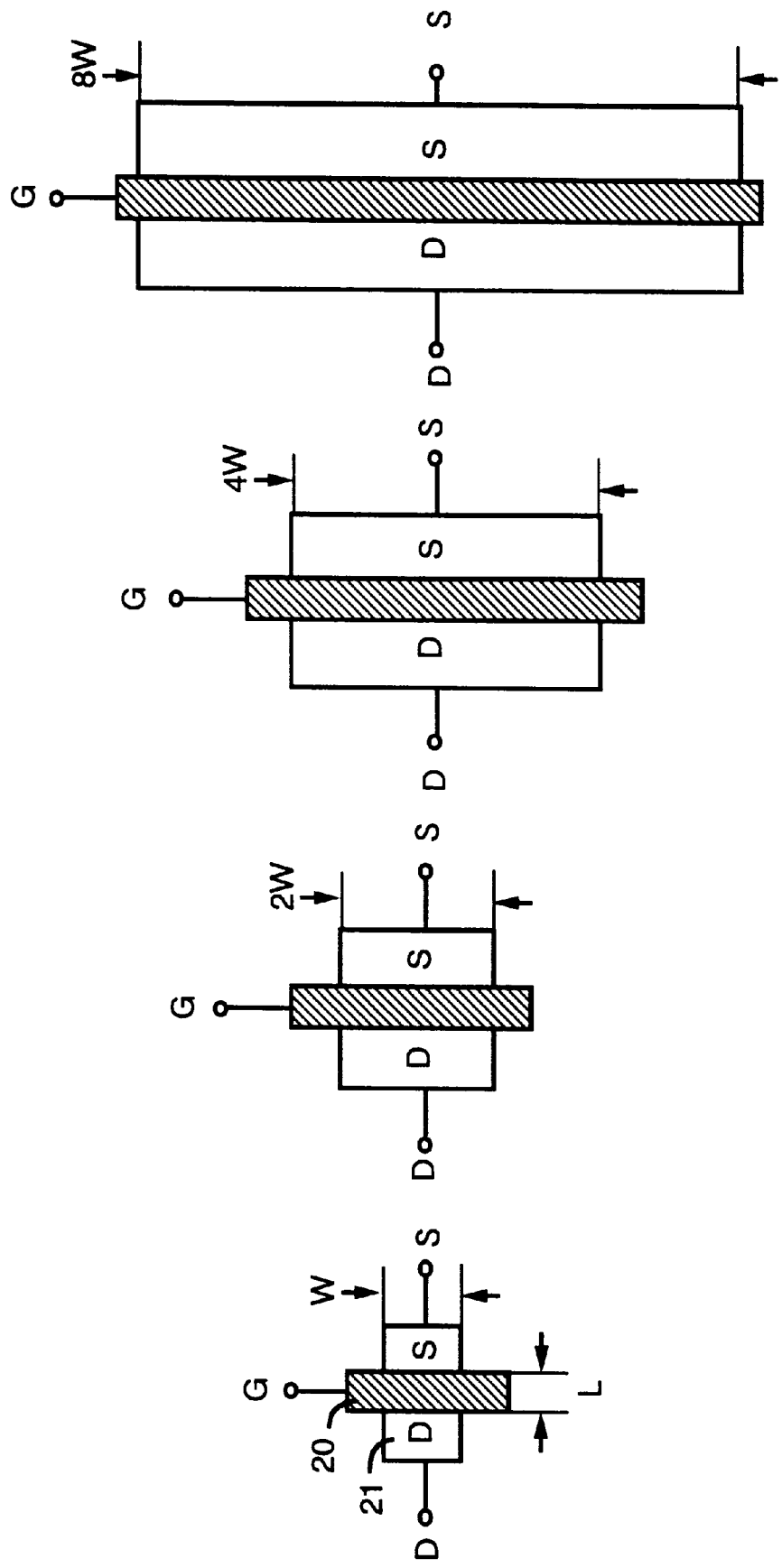

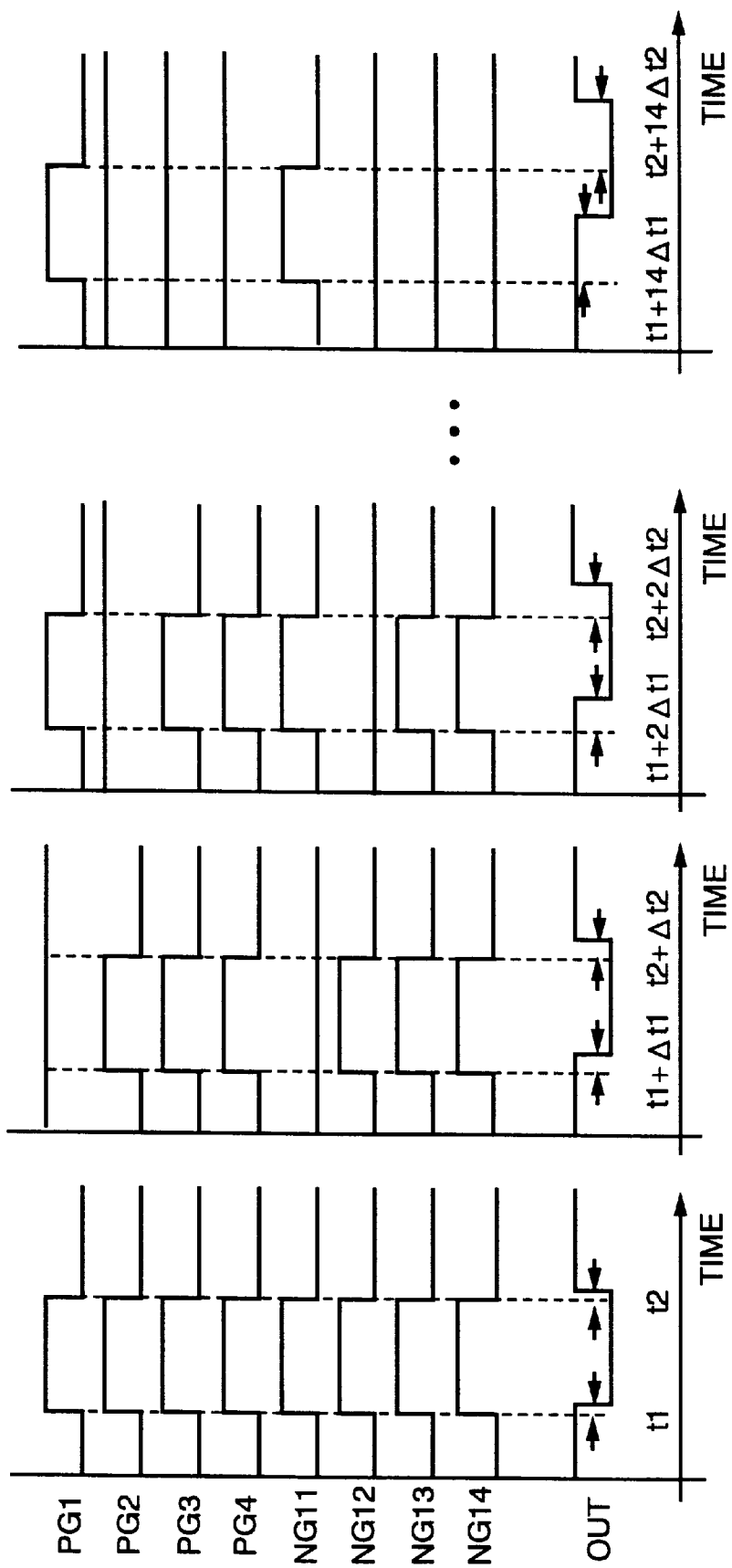

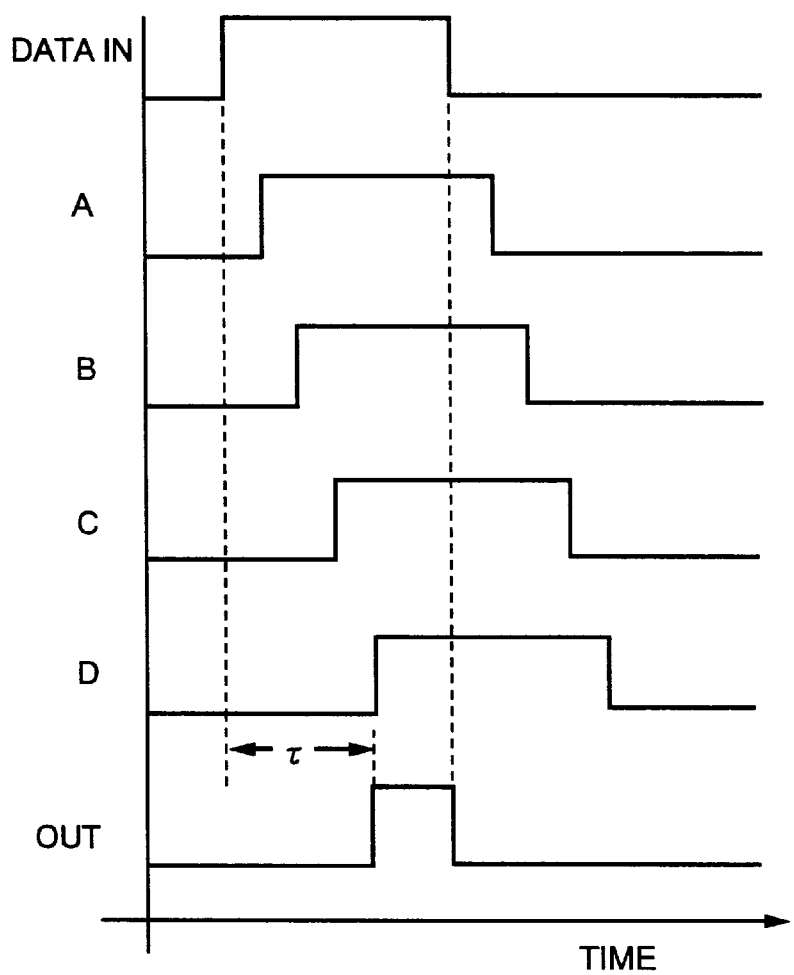
FIG. 26A (PRIOR ART) DATA IN
FIG. 26B (PRIOR ART) A
FIG. 26C (PRIOR ART) B
FIG. 26D (PRIOR ART) C
FIG. 26E (PRIOR ART) D
FIG. 26F (PRIOR ART) OUT

VARIABLE DELAY CIRCUIT FOR VARYING DELAY TIME AND PULSE WIDTH

BACKGROUND OF THE INVENTION

1. Field of the Invention

The present invention relates to a variable delay circuit for varying delay time and pulse width in a semiconductor integrated circuit.

2. Description of the Prior Art

Since the frequencies used in recent semiconductor integrated circuits have risen, the standard data set-up time and hold time, which are set for reading out data, for example, a set-up time 2.5 ns and hold time 0.5 ns being required for 200 MHz, in response to a clock signal has become more strict. The set-up time and the hold time are defined as periods which are set in relation to a clock signal to read out data in a flip-flop. During this set-up time, the input data must exist at an input of the flip-flop before the clock rises. During the hold time, the data must also exist at an input of the flip-flop after the clock has risen. In order for the input data to be read out correctly, the data must exist at the input of the flip-flop during these periods. In order to satisfy this requirement, a delay buffer is provided before the input terminal of the flip-flop in a conventional device for adjusting the data set-up time and the hold time.

FIG. 24 shows a conventional variable delay circuit disclosed in the Japanese laid-open patent publication 63-9220. The circuit of FIG. 24 comprises a terminal 41 for supplying power, an input terminal 42 for receiving data, an output terminal 43 for outputting delayed data, control terminals 44–47 for controlling the data delay time, four P channel MOS transistors 48 connected in parallel, four N channel MOS transistors 49 connected in parallel, decoders 50 and 51 for decoding the control signals input from the control terminals 44–47, and selectors 52 and 53 for controlling the gates of the P channel MOS transistors 48 and the gates of the N channel MOS transistors 49 based on the output signal decoded in the decoders 50 and 51.

The operation of the circuit illustrated in FIG. 24 is explained below. The control signals are input to the control terminals 44–47 and decoded by the decoders 50 and 51. The decoded signals turn on and off an arbitrary number of the P channel MOS transistors 48 or the N channel MOS transistors 49. The more transistors operating in parallel, the shorter the delay time, and the fewer transistors operating in parallel, the longer the delay time. This means that it is possible to vary the delay time by controlling the number of operating transistors, which are connected in parallel, using the control signals. A desired set-up time or hold time has been achieved in this manner.

FIG. 25 shows a conventional variable pulse width circuit that is commonly used. The circuit of FIG. 25 comprises a data input terminal 31, a data output terminal 37, unit delaying elements 32–35, and an AND circuit 36 for logically summing the data signals from the input terminal 31 and the signal delayed by the delay elements 32–35. FIGS. 26A–26F are timing charts illustrating how a data signal is delayed. In FIGS. 26A–26F, DATA IN, A, B, C, D, and OUT indicate the waveforms of signals at the locations of the corresponding reference symbols in the circuit of FIG. 25. As shown in FIG. 26A, the data signal is input to the input terminal 31, and sequentially delayed in the respective delaying elements, and the AND circuit 36 logically sums up the output (the waveform at D) of the delaying element 35 and the input signal from the data input terminal 31 (the waveform at DATA IN) to obtain the waveform shown in FIG. 26F. This waveform at OUT (FIG. 26F) is output as the input waveform (FIG. 26A) with a delay of time period τ. In this manner, the circuit shown in FIG. 25 is used to vary a pulse width.

However, since the respective gate widths of the P channel MOS transistors 48 and N channel MOS transistors 49 are constant, the circuit of FIG. 24 cannot control a minute delay time shorter than a predetermined length, which is determined by the unit transistor. For this reason, it has been difficult to adjust the desired set-up time and the hold time minutely.

Moreover, the variable pulse width circuit shown in FIG. 25 could not control a minute delay time shorter than a predetermined length, which is determined by the unit delay element. The present invention is created to solve these problems.

SUMMARY OF THE INVENTION

It is an object of the present invention to provide a variable delay circuit for varying the delay time of input signals minutely and for outputting the delayed signals to an output terminal.

It is another object of the present invention to provide a variable delay circuit which can meet the strict standard of set-up time and hold time even if operation frequency rises.

According to one aspect of the invention, a first variable delay circuit for controlling the delay time includes a plurality of P channel transistors connected in parallel, each P channel transistor having a source electrode, a drain electrode, and a gate electrode, and having a different gate size, the respective source electrodes being connected to a power supply, the respective drain electrodes being connected to an output terminal of the circuit for providing a delayed signal, and the respective gate electrodes being connected to respective P channel control signal input terminals for receiving control signals. The circuit further includes a plurality of N channel transistors connected in parallel, each N channel transistor having a source electrode, a drain electrode, and a gate electrode, and having different gate size, the respective source electrodes being connected to ground, the respective drain electrodes being connected to the output terminal of the circuit, and the respective gate electrodes being connected to respective N channel control signal input terminals.

Preferably, the first variable delay circuit includes a selector comprising a plurality of first logic elements, each first logic element having a first input terminal, a second input terminal, and an output terminal, and a plurality of second logic elements, each second logic element having a first input terminal, a second input terminal and an output terminal, the output terminals of the first logic elements being connected to corresponding gate electrodes of the P channel transistors, the output terminals of the second logic elements being connected to corresponding gate electrodes of the N channel transistors, respective first input terminals of the first logic elements and of the second logic elements being connected to corresponding control signal input terminals, the respective second input terminals of the first logic elements and of the second logic elements being connected to a data input terminal for receiving a data signal. The control signals are applied to the control signal input terminals control delay of a data signal input to the data input terminal.

Preferably, the first variable delay circuit includes a selector comprising a plurality of first logic elements, each first logic element having a first input terminal, a second input terminal, and an output terminal connected to a corresponding gate electrode of a corresponding P channel transistor, and a plurality of second logic elements, each second logic element having a first input terminal, a second input terminal, and an output terminal connected to a gate electrode of a corresponding N channel transistor. The circuit further includes a memory circuit comprising a plurality of memory elements, each memory element having a first input terminal, a second input terminal, and an output terminal, the respective first input terminals of the memory elements being connected to corresponding control terminals, the second input terminals of the memory elements being connected to a set signal input terminal for receiving a set signal, the output terminals of the memory elements being connected to respective first input terminals of corresponding first logic elements in the selector and to respective first input terminals of corresponding second logic elements in the selector, wherein control signals in the memory elements are set in response to a set signal applied to the set signal input terminals for controlling the delay of a data signal input to the data input terminal and for outputting a delayed signal at the output terminal of the circuit.

According to another aspect of the invention, a second variable delay circuit for controlling the delay time includes a plurality of P channel transistors connected in parallel, each P channel transistor having a source electrode, a drain electrode, and a gate electrode, and having a different gate size, the respective source electrodes being connected to a power supply, the respective drain electrodes being connected to an output terminal of the circuit for providing a delayed signal, and the respective gate electrodes being connected to respective control signal input terminals for receiving control signals. The circuit further includes an N channel transistor having a source electrode, a drain electrode, and a gate electrode, the source electrode being connected to ground, the drain electrode being connected to the output terminal of the circuit, and the gate electrode being connected to a data input terminal.

Preferably, the second variable delay circuit includes a selector comprising a plurality of logic elements, each logic element having a first input terminal, a second input terminal, and an output terminal, the output terminals of the logic elements being connected to corresponding gate electrodes of the P channel transistors, the respective first input terminals of the logic elements being connected to respective control signal input terminals, the respective second input terminals of the logic elements being connected to a data input terminal for receiving a data signal. The desired signals are applied to the control signal input terminals control delay of a data signal input to the data input terminal.

Preferably, the second variable delay circuit further includes a selector comprising a plurality of logic elements, each logic element having a first input terminal, a second input terminal, and an output terminal connected to a corresponding gate electrode of a respective P channel transistor, the second input terminals being connected to the data input terminal. The circuit further includes memory circuit comprising a plurality of memory elements, each memory element having a first input terminal, a second input terminal, and an output terminal, respective first input terminal being connected to corresponding control signal input terminals, the second input terminals being connected to a set signal input terminal for receiving a set signal, the output terminals being connected to respective first input terminals of corresponding logic elements in the selector. The control signals are set in the memory elements in response to a set signal applied to the set signal input terminal for controlling delay of a data signal input to the data input terminal.

According to a further aspect of the invention, a third variable delay circuit includes a plurality of N channel transistors connected in parallel, each N channel transistor having a source electrode, a drain electrode, and a gate electrode, and having different gate size, the respective source electrodes being connected to ground, the respective drain electrodes being connected to an output terminal of the circuit for providing a delayed signal, and the respective gate electrodes being connected to respective control signal input terminals for receiving control signals. The circuit further includes a P channel transistor having a source electrode, a drain electrode, and a gate electrode, the source electrode being connected to a power supply, the drain electrode being connected to the output terminal, and the gate electrode being connected to a data input terminal.

Preferably the third variable delay circuit includes a selector comprising a plurality of logic elements, each logic element having a first input terminal, a second input terminal, and an output terminal, the output terminals of the logic elements being connected to corresponding gate electrodes of the N channel transistors, the respective first input terminals of the logic elements being connected to respective control signal input terminals, the respective second input terminals of the logic elements being connected to a data input terminal for receiving a data signal. The control signals are applied to the control signal input terminals control delay of a data signal input to the data input terminal.

Preferably, the third variable delay circuit includes a selector comprising a plurality of logic elements, each logic element having a first input terminal, a second input terminal, and an output terminal connected to a corresponding gate of a respective N channel transistor, the second input terminals being connected to the data input terminal. The circuit further includes a memory circuit comprising a plurality of memory elements, each memory element having a first input terminal, a second input terminal, and an output terminal, the respective first input terminals being connected to corresponding control signal input terminals, the second input terminals being connected to a set signal input terminal for receiving a set signal, the output terminals being connected to respective first input terminals of corresponding logic elements in the selector. The control signals are set in the memory elements in response to a set signal applied to the set signal input terminal for controlling delay of a data signal input to the data input terminal.

In the variable delay circuit, the P channel transistors have different gate widths, and the ratio of the respective gate widths is represented as $m \times 2^0 : m \times 2^1 : m \times 2^2 : m \times 2^3 : \ldots : m \times 2^i$ (where i is an positive integer).

In the variable delay circuit, the N channel transistors have different gate widths, and the ratio of the respective gate widths is represented as $n \times 2^0 : n \times 2^1 : n \times 2^2 : n \times 2^3 : \ldots : n \times 2^i$ (where i is an positive integer).

In the variable delay circuit, the P channel transistors and the N channel transistors respectively include a plurality of gate electrodes having constant widths, and the ratio of the respective gate electrode widths is represented as $1 : 2 : 2^2 : 2^3 : \ldots : 2^i$ (where, i is an positive integer).

The output terminal of the variable delay circuit is connected to a D terminal of a D flip-flop circuit, a T terminal of the D flip-flop being connected to a clock signal input terminal in order to correctly read a signal input to the D terminal of the D flip-flop circuit in response to a clock signal.

BRIEF DESCRIPTION OF THE DRAWINGS

FIGS. 2A–2D show transistors according to the present invention with various gate widths W.

FIGS. 4A–4D are timing charts showing the operation of the variable delay circuit according to the first embodiment of the present invention.

FIGS. 26A–26F are timing charts showing how the data signals are delayed in the conventional variable delay circuit of FIG. 25.

DETAILED DESCRIPTION OF THE PREFERRED EMBODIMENTS

Embodiment 1

Figure 1:
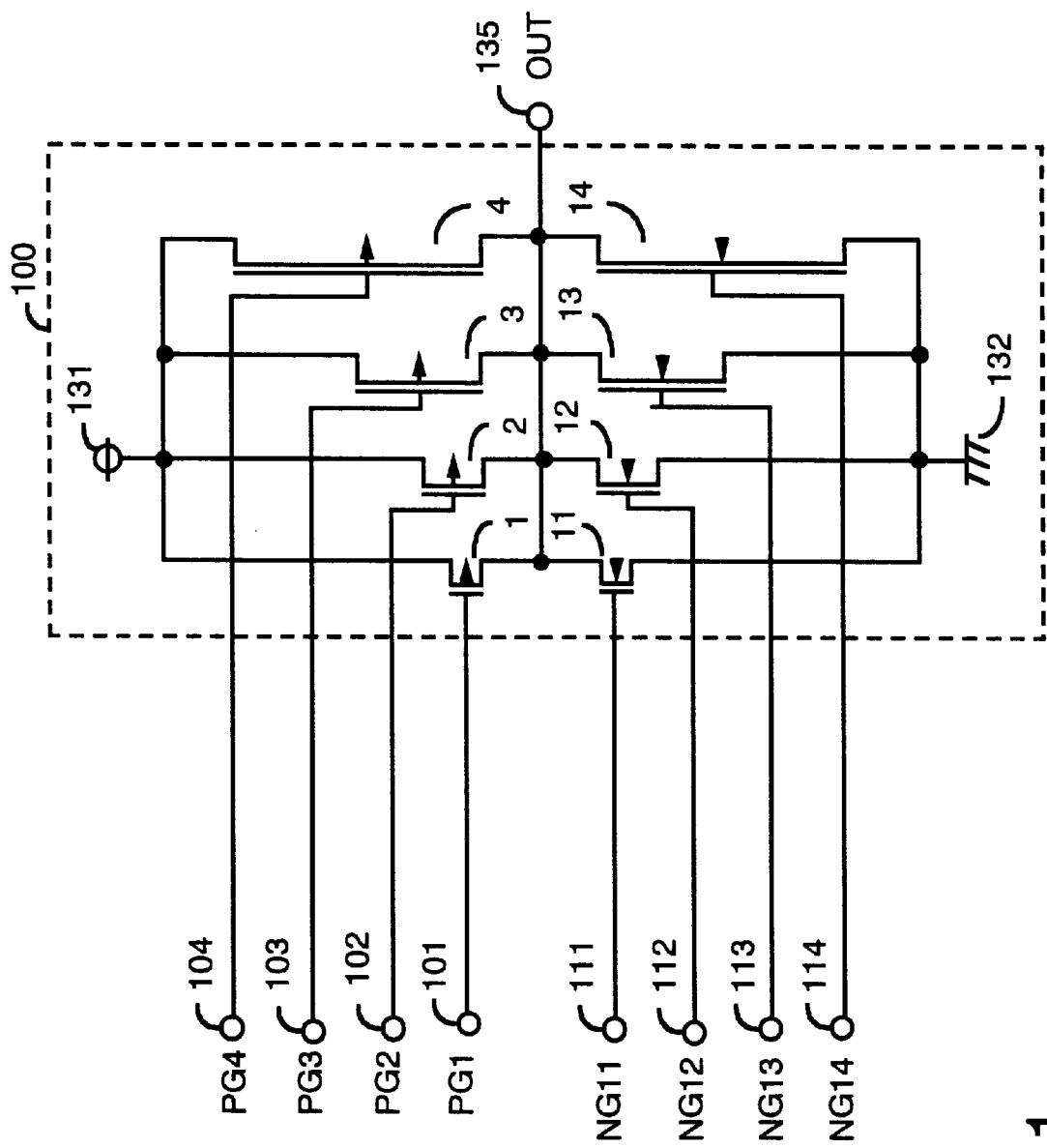
FIG. 1 shows a variable delay circuit according to a first embodiment of the present invention.
Figure 3A:
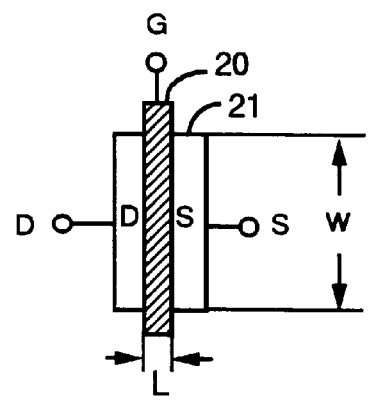
FIGS. 3A–3D show transistors according to the present invention with various gate line widths L.
Figure 3B:
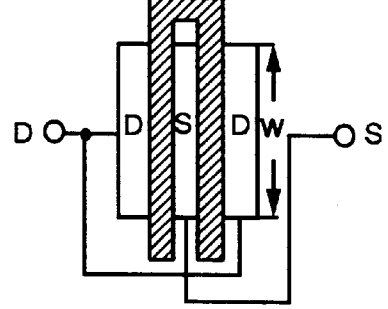
Figure 3C:
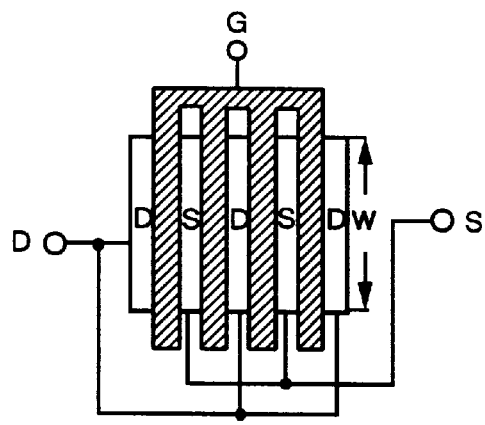
Figure 3D:
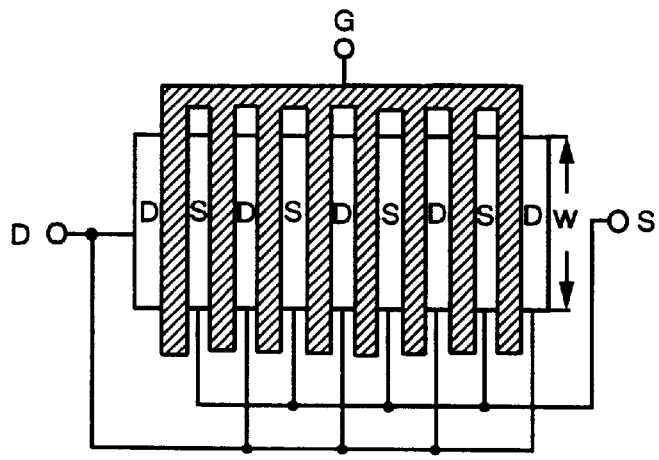

FIG. 1 shows a basic variable delay circuit according to a first embodiment of the present invention. The variable delay circuit comprises a plurality of P channel transistors 1–4 and a plurality of N channel transistors 11–14. The respective P channel transistors 1–4 have different gate widths, and they are connected in parallel. The respective N channel transistors 11–14 have different gate widths, and they are connected in parallel. The gate widths W of the P channel MOS transistors 1–4 are m, 2m, 4m and 8m (m=unit gate width), respectively. The gates of the P channel MOS transistors 1–4 are respectively connected to the input terminals 101–104, the drains are connected to the output terminal 135, and the sources are connected to the power supply VDD 131. The gate widths W of the N channel MOS transistors 11–14 are n, 2n, 4n and 8n (n=unit gate width), respectively. The respective gates of the N channel MOS transistors 11–14 are connected to the input terminals 111–114, the drains are connected to the output terminal 135, and the sources are connected to the ground 132.

FIGS. 2A–2D and FIGS. 3A–3D show the P channel MOS transistors 1–4 and the N channel MOS transistors 11–14. The respective transistors of FIGS. 2A–2D and FIGS. 3A–3D comprise a gate electrode 20 and one or more channels 21 located between the respective drains and sources. In FIGS. 2A–2D and 3A–3D, D represents a drain, S represents a source, and G represents a gate, and also are as a drain electrode, a source electrode, and the gate electrode, respectively, are represented by circles. FIG. 2A illustrates a construction of the P channel MOS transistor 1 and N channel MOS transistor 11, FIG. 2B illustrates a construction of the P channel MOS transistor 2 and N channel MOS transistor 12, FIG. 2C illustrates a construction of the P channel MOS transistor 3 and N channel MOS transistor 13, and finally FIG. 2D illustrates a construction of the P channel MOS transistor 4 and N channel MOS transistor 14. In the present invention, a plurality of transistors with different delay times, from the long delay time of in the transistor of FIG. 2A to the short delay time of the transistor of FIG. 2D are connected in parallel to change the delay time. By selectively connecting these transistors in parallel and setting the delay time of the transistor of FIG. 2A to be extremely short, it is possible to obtain discrete delay times from a very short delay to a long delay.

The delay time of the transistors depends on the line width L and gate width W of the respective transistors. If the line width L of the gate is small, the delay time becomes short, and if the gate width W is large, the delay time becomes short. On the contrary, if the line width L of the gate is large, the delay time becomes long, and if the gate width W is small, the delay time becomes long. The gate line width L cannot be chosen in an arbitrary manner, since it is determined by the LSI production process. Taking advantage of the characteristics of these transistors, a plurality of the transistors shown in FIG. 2A–FIG. 2D are defined. FIG. 2A illustrates a first transistor having the smallest unit gate line width L and gate width W. FIG. 2B shows a second transistor having the same gate line width L as that of transistor of FIG. 2A, and a gate width of 2W, twice that of the transistor of FIG. 2A. This second transistor has approximately half the delay time of the transistor of FIG. 2A. FIG. 2C shows a third transistor having the same gate line width L as that of transistor of FIG. 2A, and a gate width of 4W, four times that of the transistor of FIG. 2A. This third transistor has approximately one fourth the delay time of that of the transistor of FIG. 2A. FIG. 2D shows a fourth transistor having the same gate line width L as that of the transistor of FIG. 2A, and a gate width of 8W, eight times that of the transistor shown in FIG. 2A. This fourth transistor has approximately one eighth the delay time of that of the transistor of FIG. 2A.

The respective line widths L of the transistors of FIGS. 2A–2D have the relationship of 2n, and the delay time of the transistors of FIGS. 2A–2D are respectively $\frac{1}{2}^0$ (=1), $\frac{1}{2}^1$ (=½), $\frac{1}{2}^2$ (=¼), $\frac{1}{2}^3$ (=⅛). Therefore, if these transistors of FIGS. 2A–2D are used for the transistors 1–4 and transistors 11–14 in FIG. 1, it is possible to obtain fifteen different combination of delays by selectively applying the control signals PG1–PG4 and NG1–NG4 to the respective input terminals. The control signals PG1–PG4 and NG1–NG4 have the voltage of data signal DATA, the constant logic "H", or the constant logic "L".

As shown in FIGS. 3A–3D, when a long gate length is desired, it is possible to connect a plurality of gate lines in parallel, which has the same effect as increasing the gate length L illustrated FIGS. 2A–2D.

The operation of the variable delay circuit in FIG. 1 is explained below. FIGS. 4A–4D are timing charts illustrating the operation of the variable delay circuit according to the present invention of FIG. 1. FIG. 4A illustrates a case when all of the input terminals 101–104 and input terminals 111–114 are supplied with data signals (or control signals PG1–PG4, NG1–NG4) changing as "0→1→0", that is, as logic "L"→logic "H"→logic "L".

When the control signals PG1–PG4 and NG1–NG4 change from 0 to 1, that is, change from logic "L" to logic "H", all the P channel MOS transistors 1–4 turn off, and contrarily all the N channel transistors 11–14 turn on. When the N channel MOS transistors 11–14 turn on, the output signal at the output terminal 135 changes from logic "H" to logic "L". At this time, since the N channel MOS transistors 11–14 are all connected in parallel as shown in FIG. 4A, the sum of their respective gate widths is W+2W+4W+8W=15W, and this is the largest gate width combination possible. This means that the delay time at this time is the shortest possible. That is to say, the delay time is t1 when the pulse is falling as shown in FIG. 4A.

Alternatively, when the control signals NG1–NG4 change from 1 to 0, that is, change from the logic "H" to the logic "L", all the N channel MOS transistors 11–14 turn off, while all the P channel MOS transistors 1–4 turn on as shown in FIG. 4A. Therefore, the output waveform of the output terminal 135 changes from logic "L" to logic "H" as shown in FIG. 4A.

At this time, the P channel MOS transistors 1–4 are all connected in parallel, and the sum of the gate widths is W+2W+4W+8W=15W, and this is the widest gate width combination possible. This means that the delay time is at the shortest possible. That is to say, the delay time is t2 when the pulse is rising as shown in FIG. 4A. In this manner, when the input signal changes as 0→1→0, the output signal at the output terminal 135 has a waveform changing as 1→0→1 with the delay time t1 when the pulse is falling, and the delay time t2 when the pulse is rising. The fall delay time t1 may be the same as the rise delay time t2.

FIG. 4B illustrates the delay characteristic when the data signals are input to the input terminals 102–104 and the input terminals 112–114, and the logic "H" of the control signal PG1 is input to the terminal 101, the logic "L" of the control signal NG11 is input to the terminal 111, and then the P channel MOS transistor 1 and the N channel MOS transistor 11 are always off.

When the input data signal changes from 0 to 1, the P channel MOS transistors 2–4 turn off, and the N channel MOS transistors 12–14 turn on. Therefore, at this time, the output waveform at the output terminal 135 changes from logic "H" to logic "L". The sum of the gate widths of the N channel MOS transistors 12–14 is 2W+4W+8W=14W. Since this sum of the gate widths is smaller by W than that of the transistors of FIG. 4A, so the delay time becomes longer by $\Delta t1$ than that shown in FIG. 4A. Therefore, a falling waveform having the delay time t1+$\Delta t1$ delayed from the input signal is output at the output terminal 135 in response to the input data signal.

When the input data signal changes from 1 to 0, the N channel MOS transistors 12–14 turn off, and the P channel MOS transistors 2–4 turn on. Therefore, the output waveform at the output terminal 135 changes from logic "L" to logic "H". At this time, the sum of the gate widths of the P channel MOS transistors 2–4 is 2W+4W+8W=14W. Since this sum is smaller by W than the sum of the gate widths of the transistors in FIG. 4A, the delay time becomes longer by $\Delta t2$ than that shown in FIG. 4A. Therefore, a rising waveform having the delay time t2+$\Delta t2$ delayed from the input signal is output at the output terminal 135 in response to the input data signal. The fall delay time t1+$\Delta t1$ may be the same as the rise delay time t2+$\Delta t2$.

FIG. 4C illustrates the delay characteristic when the data are input to the input terminals 101, 103, and 104, and input terminals 111, 113, and 114, the logic "H" is input to the input terminal 102, and the logic "L" is input to the input terminal 112, and thereby the P channel MOS transistors 2 and the N channel MOS transistor 12 are always off.

When the input data signal changes from 0 to 1, the P channel MOS transistors 1, 3, and 4 turn off, and the N channel MOS transistors 11, 13, and 14 turn on. Therefore, the output waveform at the output terminal 135 changes from logic "H" to logic "L". At this time, the sum of the gate widths is W+4W+8W=13W. Since this sum is smaller by 2W than the sum of the gate widths of the transistors in FIG. 4A, the delay time becomes longer by 2$\Delta t1$ than that shown in FIG. 4A. Therefore, the output terminal 135 outputs the output of waveform having the rise delay time t1+2$\Delta t1$ delayed from the input signal.

When the input data signal changes from 1 to 0, the P channel MOS transistors 1, 3, and 4 turn on, and the N channel MOS transistors 11, 13, and 14 turn off. Therefore, the output waveform at the output terminal 135 changes from logic "L" to logic "H". At this time, the sum of the gate widths of the P channel MOS transistors 1, 3 and 4 is W+4W+8W=13W. Since this sum is smaller by 2W than the sum of the gate widths of the transistors in FIG. 4A, the delay time becomes longer by 2$\Delta t2$ than the delay illustrated in FIG. 4A. Therefore, the output terminal 135 outputs a waveform having the rise delay time t2+2$\Delta t2$ delayed from the input signal. The fall delay time t1+2$\Delta t1$ may be the same as the rise delay time t2+2$\Delta t2$.

FIG. 4D illustrates the delay characteristic when the data are input to the input terminal 101 and the input terminal 111, the logic "H" is input to the input terminals 102–104, the logic "L" is input to the input terminals 112–114, and thereby the P channel MOS transistors 2–4 and the N channel MOS transistors 12–14 are always off.

When the input data signal changes from 0 to 1, the P channel MOS transistor 1 turns off, and the N channel MOS transistor 11 turns on. Therefore, the output waveform at the output terminal 135 changes from logic "H" to logic "L". At this time, the total gate width is W. Since this sum is smaller by 14W than the sum of the gate width of the transistors in FIG. 4A, the delay time becomes longer by 14Δt1 than the delay illustrated in FIG. 4A. Therefore, the output terminal 135 outputs a waveform having the rise delay time t1+14Δt1 delayed from the input signal.

When the input data signal changes from 1 to 0, the P channel MOS transistor 1 turns on, and the N channel MOS transistor 11 turns off. Therefore, the output waveform at the output terminal 135 changes from logic "L" to logic "H". The total gate width of the P channel MOS transistor 1 at this time is W. Since this sum is smaller by 14W than the sum of the gate widths of the transistors in FIG. 4A, the delay time becomes longer by 14Δt2 than that of FIG. 4A. Therefore, the output terminal 135 outputs a waveform having the rise delay time t2+14Δt2 delayed from the input signal.

In this manner, it is possible to change the delay times Δt1 and Δt2 by changing the gate widths. By making the Δt1 and Δt2 short, it is possible to solve the problem of the prior art that the variable delay time cannot be brought below a desired level. Moreover, the variable delay circuit of the present invention is able to adapt to the strict standard for the set-up time and hold time required by the rise in operation frequency. In the foregoing explanation, the P channel MOS transistors and N channel transistors are respectively present in four stages. However, the same effect can be obtained with more or fewer stages.

Embodiment 2

Figure 5:
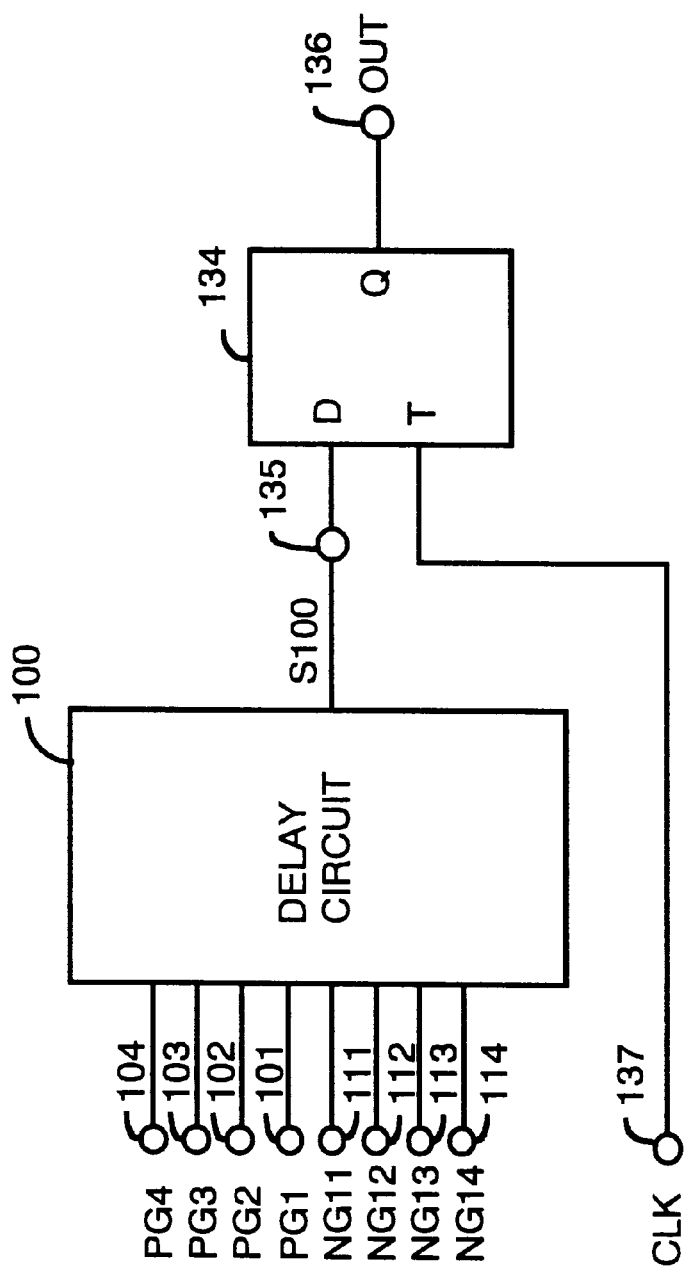
FIG. 5 shows a variable delay circuit according to a second embodiment of the present invention.

The variable delay circuit according to a second embodiment of the present invention is explained below. FIG. 5 shows a variable delay circuit 100 of FIG. 1 being used as a delay buffer for a flip-flop 134. In FIG. 5, the output S100 from the variable delay circuit 100 is input to the data input terminal D of the flip-flop 134 via an output terminal 135. The clock signal (CLK) is input to the clock signal input terminal T of the flip-flop 134. The control signals PG1–PG4 and NG1–NG4 are input to the variable delay circuit 100 in the same manner as in FIG. 1. The control signals PG1–PG4 and NG1–NG4 are any one of the data signal DATA, the logic "H", and the logic "L".

Figure 6:
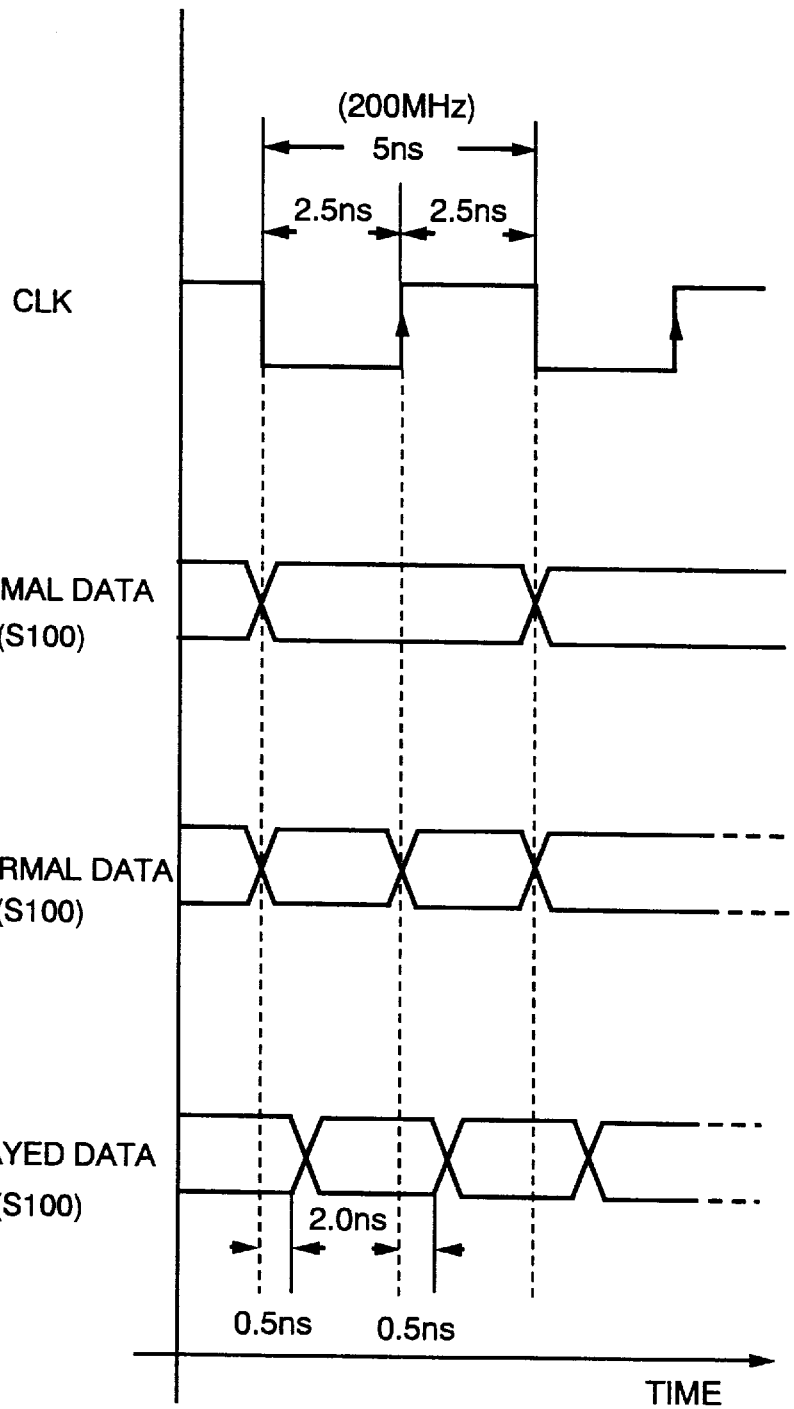
FIGS. 6A–6D show the signal waveforms in the respective portions of the circuit shown in FIG. 5.

FIGS. 6A–6D show waveforms in respective portions of the circuit of FIG. 5. FIG. 6A illustrates the waveform of the clock signal CLK input to the clock signal input terminal T. For example, a clock signal waveform having a frequency of 200 MHz is depicted in FIG. 6A. FIG. 6B illustrates a normal data input to the data input terminal D of the flip-flop 134, and FIG. 6C shows an abnormal data input to the input terminal D of the flip-flop 134.

Normal data is defined as data which is normally output from the terminal Q in response to the input clock signal CLK input to the input terminal D of the flip-flop 134. Abnormal data is defined as data which is abnormally output from the terminal Q in response to the input clock signal CLK input to the input terminal D of the flip-flop 134. FIGS. 6A–6D are explained below using an example where the set-up time and hold time in the flip-flop 134 are set to 2.0 ns and 0.5 ns, respectively.

In the system, the set-up time is assumed to be 2.5 ns and the hold time to be 2.5 ns, as shown in FIG. 6A. When the normal data shown in FIG. 6B is input to the input terminal D of the flip-flop 134, the flip-flop 134 can read out the input data correctly without producing any errors. On the contrary, when the abnormal waveform having a set-up time of 2.5 ns and a hold time of 0 ns as shown in FIG. 6C is input to the data input terminal D of the flip-flop 134, the flip-flop 134 cannot read out the input data correctly. Therefore, the variable delay circuit 100 is provided before the data input terminal D of the flip-flop 134 to obtain the normal input data shown in FIG. 6C, which can be read correctly. In this case, since the variable delay circuit 100 needs to delay a desired time determined by the waveform of the input data, the variable delay circuit 100 must be adjusted finely.

For example, in order to correctly read out the input data signal input to the flip-flop 134 shown in FIG. 6C, the delay time of the variable delay circuit 100 should be adjusted to 0.5 ns, which causes the set-up time to be 2.0 ns and hold time to be 0.5 ns, as shown in FIG. 6D, at the data input terminal of flip-flop 134. As explained above, even abnormal data as shown in FIG. 6C can be read out correctly by delaying the abnormal data for a desired period of time, so that a set-up time and a hold time can be obtained within the standard.

FIGS. 7A–7D show the signal waveforms at the respective portions of the circuit illustrated in FIG. 5. Since the timing charts of the control signals PG1–PG4, NG1–NG4, and the output signal S100 illustrated in FIGS. 7A–7D are the same as those of the FIGS. 4A–4D, detailed explanation is omitted. Using FIGS. 7A–7D, it is explained below how the set-up time (s) and the hold time (h) can be changed by adjusting the delay time output from the variable delay circuit 100, in comparison to clock signal CLK.

Figure 7:
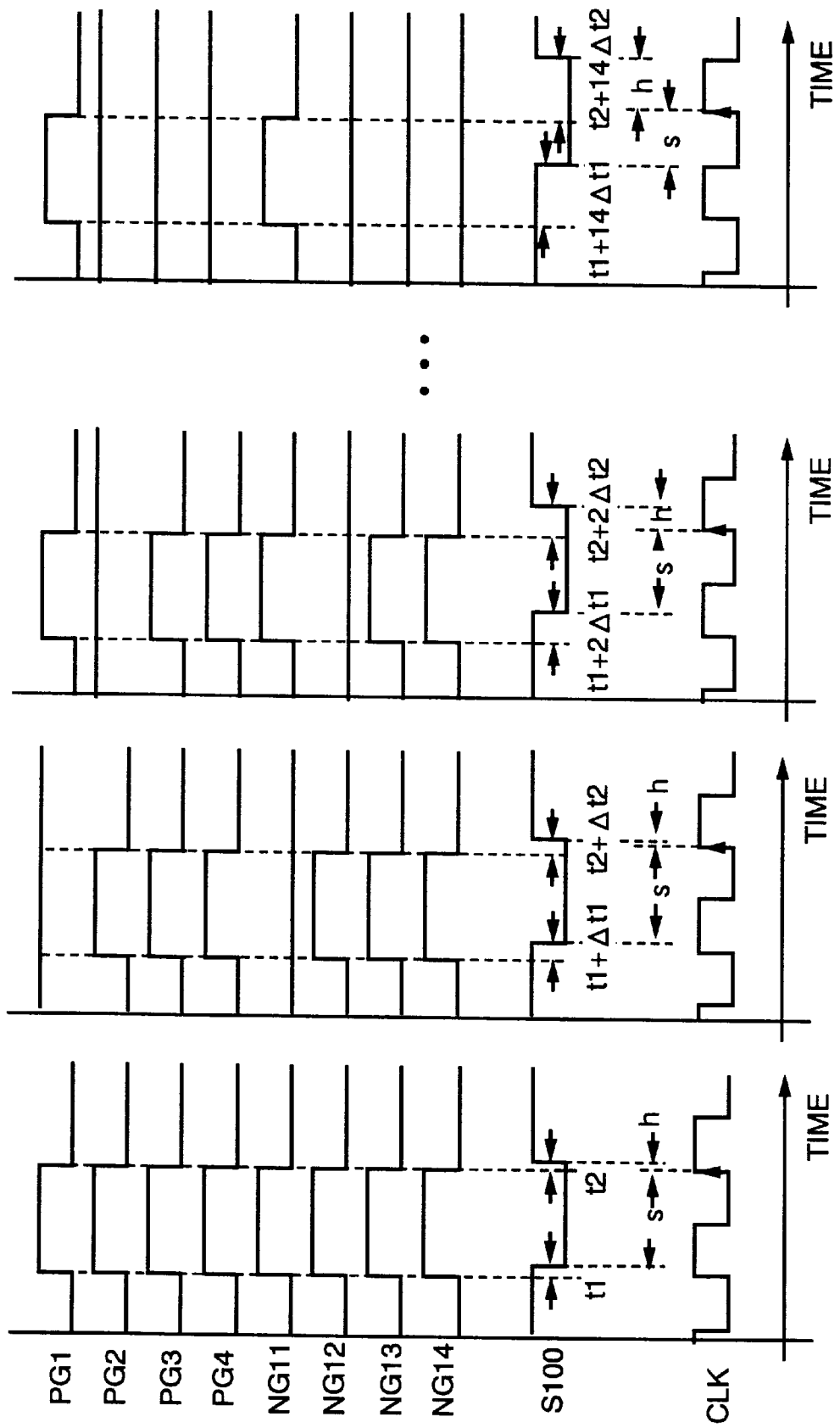
FIGS. 7A–7D are timing charts showing the operation of the variable delay circuit according to a second embodiment of the present invention.

In FIG. 7A, the delay time of the output S100 is t1 when the pulse is falling and t2 when the pulse is rising, and t1 and t2 being the shortest delay times, respectively. In FIG. 7A, although the set-up time (s) is long enough, the hold time (h) is too short to meet the standard range. Therefore, the flip-flop 134 reads out the output signal S100 incorrectly.

In FIG. 7B, the delay time of the output signal S100 is t1+Δt1 when the pulse is falling and t2+Δt2 when the pulse is rising, t1+Δt1 and t2+Δt2 being the next to the shortest delay times, respectively. At this time, the set-up time (s) is still long enough, but the hold time remains also too short to meet the standard range, thus the flip-flop 134 again reads out the output signal S100 incorrectly.

In FIG. 7C, the delay time of the output signal S100 is t1+2Δt1 when the pulse is falling and t2+2Δt2 when the pulse is rising, t1+Δt2 and t2+Δt2 being the third shortest delay times, respectively. At this time, the set-up time (s) is long enough, and the hold time (h) meets the standard range. Therefore, the flip-flop 134 reads out the output signal S100 correctly.

In FIG. 7D, the output signal S100 is t1+14Δt1 when the pulse is falling and t2+14Δt2 when the pulse is rising, t1+14Δt1 and t2+14Δt2 being the longest delay times, respectively. At this time, the hold time (h) is in the standard range, but the set-up time (s) is shorter than the standard value. Therefore, the flip-flop 134 reads out the output signal S100 incorrectly. In this manner, the flip-flop 134 reads out the output signal S100 correctly without any errors only when the delay time is set properly as shown in FIG. 7C.

As explained above, if the shortest unit delay times Δt1 and Δt2 of the variable delay circuit 100 are fairly short, the data set-up time (s) and hold time (s) can be easily changed to meet the standard range by using the variable delay circuit 100 as a delay buffer for the D input terminal of the flip-flop 134. In the past, in order to meet the strict standard for the set-up time and hold time, a plurality of delay elements had to be provided in the delay buffer to change the connection stage number of the unit delay elements. In the present invention, on the contrary, such physical change in the unit elements is not necessary, and it is possible to obtain the desired delay time by multiplying an arbitrary number by the unit delay times Δt1 and Δt2 by controlling the gate width of the transistor in response to control signals from outside of the circuit. It is also possible to vary the delay time depending on the characteristics of the input data signal, so that any input signals may be read out correctly.

Embodiment 3

Figure 8:
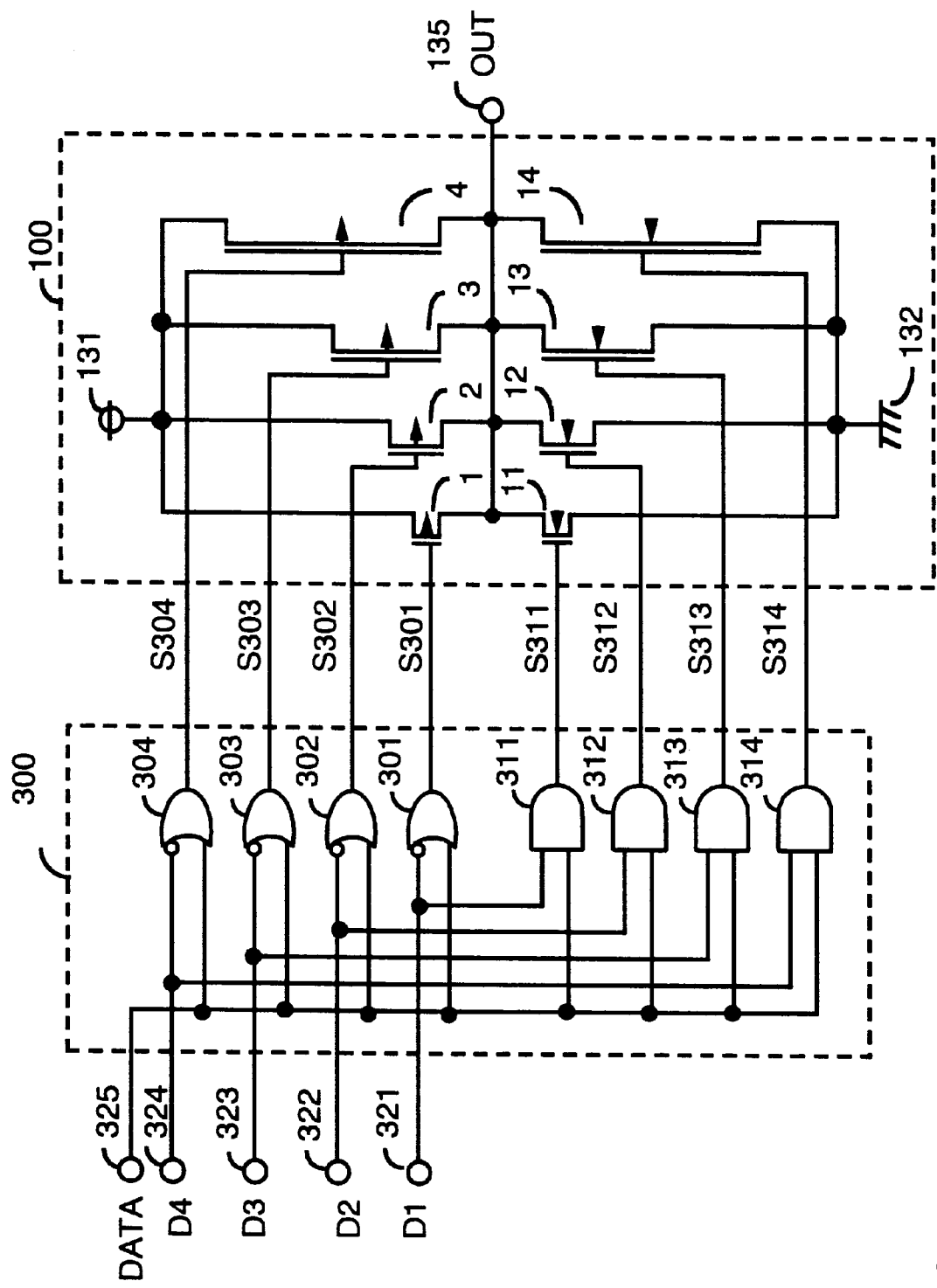
FIG. 8 shows a variable delay circuit according to a third embodiment of the present invention.

FIG. 8 shows a variable delay circuit according to a third embodiment of the present invention. FIG. 8 illustrates a variable delay circuit comprising the variable delay circuit 100 of FIG. 1 and a selector 300. In FIG. 8, the variable delay circuit 100 is the same as that of FIG. 1, so that no the explanation is necessary.

The selector 300 comprises OR circuits 301–304, each having one inverting terminal and one non-inverting terminal, and AND circuits 311–314, and their output terminals are respectively connected to the gates of the P channel MOS transistors 1–4 and N channel MOS transistors 11–14. The respective inverting terminals of the OR circuits 301–304 which are located inside the selector 300 are connected to the input terminals 321–324, and the respective non-inverting terminals are connected to an input data terminal 325. Alternatively, each one of the input terminals of the AND circuits 311–314 is connected to one of the input terminals 321–324, respectively, and the other input terminals are connected to the input terminal 325.

FIGS. 9A–9D are timing charts illustrating the operation of the variable delay circuit of FIG. 8. In FIGS. 9A–9D, control signals D1–D4 are input to the input terminals 321–324, respectively, which correspond to any of logic "H" or logic "L" indicated by hexadecimal designation. And the data signal is input to the data input terminal 325 to operate the desired number of transistors in order to delay the data signal, input from the outside of the circuit, for a desired period of time.

Figure 9:
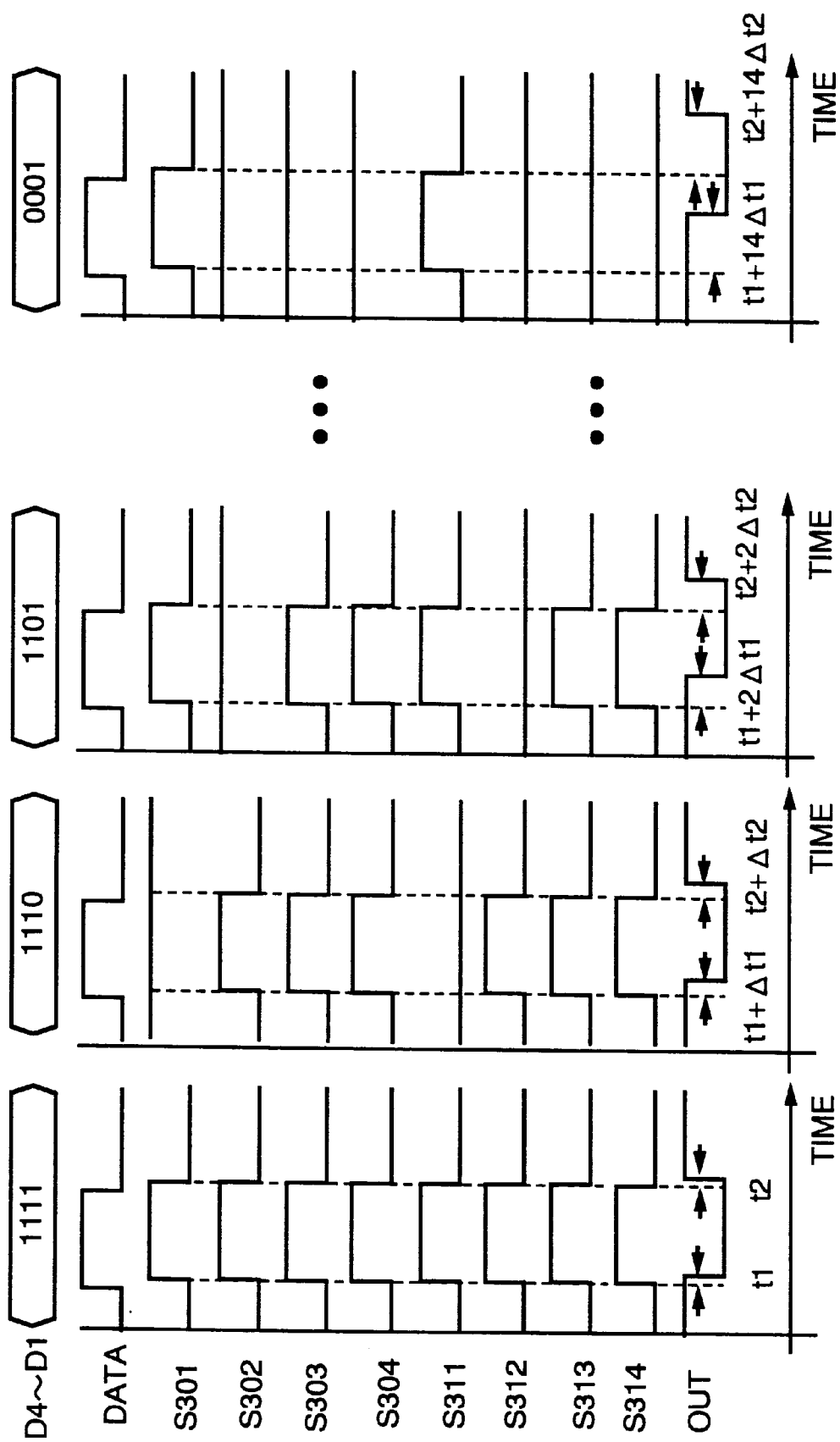
FIGS. 9A–9D are timing charts showing the operation of the variable delay circuit according to the third embodiment of the present invention.

In the example illustrated in the timing chart FIG. 9A, the control signals D1–D4 applied to the input terminals 321–324 are set to "1, 1, 1, 1". Here, "1" indicates logic "H", and "0" indicates logic "L". It is assumed that the data signal DATA input to the data input terminal 325 changes as "0→1→0", that is, as logic "L"→logic "H"43 logic "L". Since the control signals D1–D4 input to the input terminals 321–324 are "1, 1, 1,1", the logic "L" is output after the input data signals are inverted in the OR circuits 301–304. In other words, the output signals S301–S304 from the respective output terminals of the OR circuit 301–304 change as "0→1→0" with some delay, solely depending on the data DATA from the data input terminal 325.

Alternatively, since the control signals D1–D4 input to the input terminals 321–324 are "1, 1, 1, 1", the output signals S311–S314 from the respective terminals of the AND circuits 311–314 change as "0→1→0" with some delay, solely depending on the data DATA from the data input terminal 325.

The respective signals S301–S304 are output from the OR circuits 301–304 in the sequence of "0→1→0", and they are applied to the gates of the P channel MOS transistors 1–4, respectively. Therefore, all of the P channel MOS transistors 1–4 turn "on→off→on". The respective signals S311–S314 are output from the AND circuits 311–314 in the sequence of "0→1→0", and they are applied to the gates of the N channel MOS transistors 11–14. Alternatively, all of the N channel MOS transistors 11–14 turn "off→on→off". Hence, as shown at the bottom of FIG. 9A, the output terminal 135 outputs the signal OUT whose logic is "H"→"L"→"H".

As explained above, when the output signals S311–S314 change from logic "L" to logic "H", the output signal OUT is output to the output terminal 135 with the delay time t1, which is the delay time when all the N channel MOS transistors 11–14 turn on. When the output signals S301–S304 change from logic "H" to logic "L", the output signal OUT is output to the output terminal 135 with a rise delay time t2, which is the delay time when all of the P channel MOS transistors 1–4 are turned on.

In this manner, when the output signals D1–D4 are set to "1, 1, 1, 1", the data signal DATA input to the data input terminal 325 are inverted, and output to the output terminal 135 with the fall delay time t1 and the rise delay time t2.

The timing chart of FIG. 9B is explained below using an example where the control signals D1–D4 are set to "0, 1, 1, 1". It is assumed that the data signal DATA input to the data input terminal 325 changes as "0→1→0", that is, as logic "L"→logic "H"→logic "L". The control signals D2–D4 are logic "H", and D1 is logic "L". The output signals S302–S304 from the respective output terminals of the OR circuit 302–304 change as "0→1→0" with some delay, solely depending on the data DATA from the data input terminal 325. On the contrary, since the control signal D1 is logic "L", the output S301 from the OR circuit 301 is always logic "H".

In the AND circuits 311–314, the control signal D2–D4, which are input to the input terminals 322–324, are logic "H", and D1 is logic "L". Thus the output signals S312–S314 from the respective output terminals of the AND circuits 312–314 output signals change as "0→1→0" with some delay, solely depending on the input from the data input terminal 325. On the contrary, since the control signal D1 is logic "L", the output S311 from the AND circuit 311 is always logic "L".

The respective output signals S302–S304, which are output from the OR circuits 302–304, change as "0→1→0". The output signals S302–S304 are applied to the gates of the P channel MOS transistors 2–4. Therefore, the P channel MOS transistors 2–4 turn "on→off→on". On the contrary, whatever data signal DATA applied to the data input terminal 325 is, the P channel MOS transistor 1 is off, since the output S301 of the OR circuit 301 is always logic "H".

The respective output signals S312–S314 from the AND circuits 312–314 change as "0→1→0", and applied to the gates of the N channel MOS transistors 12–14. The N channel MOS transistors 12–14 turn "off→on→off". On the contrary, since the output S311 of the AND circuit 311 is always logic "L", the N channel MOS transistor 11 are always off. Therefore, as illustrated in the lowest section of FIG. 9B, the output terminal 135 outputs the output signal OUT, which changes "H"→logic "L"→logic "H", according to the change output from the AND circuits 312–314.

As the output signals S312–S314 changes from logic "L" to logic "H", the output terminal 135 outputs the signal OUT, which changes from logic "H" to logic "L", with the delay t1+Δt1 which occurs when the N channel MOS transistors 12–14 turn on. Similarly, when the output signals S302–S304 change from logic "H" to logic "L", the output terminal 135 outputs the output signal OUT, which changes from logic "L" to logic "H", with the delay t2+Δt2 which occurs when the P channel MOS transistors 2–4 turn on.

In this manner, when the control signals D1–D4 are set to "0, 1, 1, 1", the data signal DATA input to the data input terminal 325 are inverted and output from the output terminal 135 with the fall delay time t1+Δt1 and the rise delay time t2+Δt2.

In FIG. 9C, the control signals D1–D4 are set to "1, 0, 1, 1", and the data signal DATA input to the data input terminal 325 are inverted and output from the output terminal 135 with the delay time t1+2Δt1 and t2+2Δt2. On the contrary, in FIG. 9D, the control signals D1–D4 are set to "1, 0, 0, 0", and the data signal DATA input to the data input terminal 325 is inverted and output from the output terminal 135 with the delay times t1+14Δt1 and t2+14Δt2.

As described above, in the present invention, since the gate widths of the respective transistors are formed according to the ratio 1:2:4:8, it is possible to digitally vary the delay time finely, using the unit delay times Δt1 and Δt2. Therefore, the present invention can solve the problem of the conventional variable delay circuit that the minimum delay time cannot be shorter than the predetermined delay time.

Moreover, it is possible in the present invention to meet the set-up time or hold time within the strict standard range resulting from the rise in operation frequency. Although four stages of the P channel MOS transistors and four stages of the N channel MOS transistors are used in the explanation of the present circuit, the same kind of effect can be obtained in a circuit with more or fewer stages.

Embodiment 4

Figure 10:
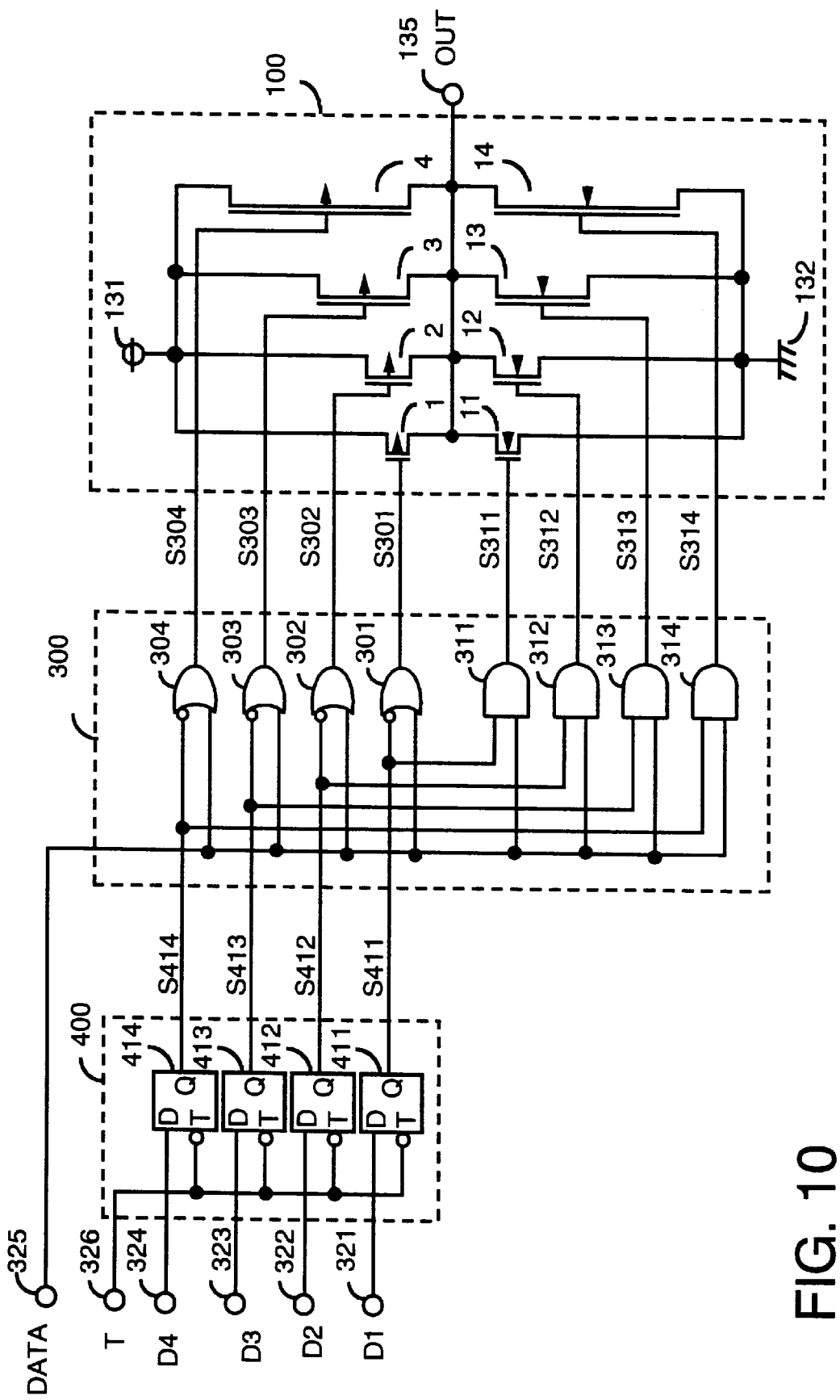
FIG. 10 shows a variable delay circuit according to a fourth embodiment of the present invention.

A fourth embodiment of the present invention is explained below. FIG. 10 includes a memory 400 in addition to the selector 300 and the variable delay circuit 100 of FIG. 8. In FIG. 10, since the variable delay circuit 100 and the selector 300 are the same as those of FIG. 8, their explanation is omitted.

The memory 400 comprises D flip-flops 411–414. The non-inverting D terminals of the flip-flops 411–414 are connected to the input terminals 321–324, respectively, and the inverting T terminals of the respective D flip-flops 411–414 are connected to the input terminal T326. The output terminals Q of the D flip-flops 411–414 are connected to the inverting input terminals of the OR circuits 301–304 in the selector 300, respectively. The non-inverting terminals of the OR circuit 301–304 in the selector 300 are connected to the data input terminal 325.

FIGS. 11A–11D are timing charts illustrating the operation of the variable delay circuit of the present invention which is illustrated in FIG. 10. In FIGS. 11A–11D, fixed voltages corresponding to logic "H" or logic "L", designated to hexadecimal, are input to the input terminals 321–324 as control signals D1–D4. At the same time, a set signal T is input to the T input terminal 326. The data signal is input to the data input terminal 325 to activate one or more desired transistors. In this manner, it is possible to control the data signal, which has been input from outside of the circuit, to obtain the desired delay time.

The memory 400 temporarily stores the control signals D1–D4, which are input from the input terminals 321–324, when the set signal T input to the T input terminal 326 changes from logic "H" to logic "L". This setting operation is performed only once at the beginning of the circuit operation to store the values of the control signals D1–D4 in the D flip-flops 411–414. After then, the variable delay circuit operates based on these values of the control signals D1–D4 stored in the D flip-flops 411–414.

Figure 11:
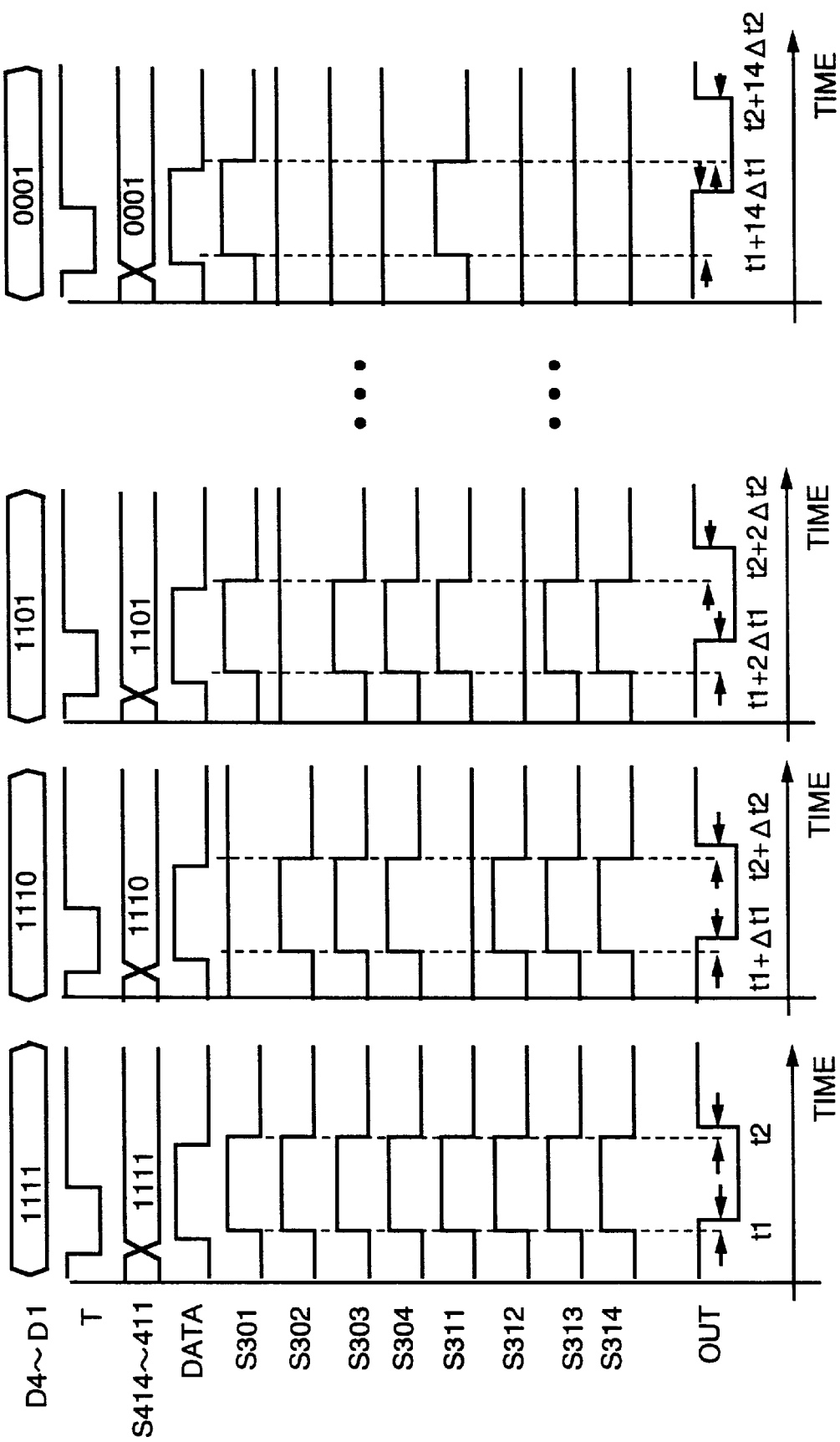
FIGS. 11A–11D are timing charts showing the operation of the variable delay circuit according to the fourth embodiment of the present invention.

In the example illustrated in the timing chart of FIG. 11A, the control signals D1–D4 applied to the input terminals 321–324 are set to "1, 1, 1, 1". Where, "1" indicates logic "H", and "0" indicates logic "L". It is assumed that the data signal DATA input to the data input terminal 325 changes as "0→1→0", that is, as logic "L"→logic "H"→logic "L".

Since all the output signals S411–S414 from the D flip-flops 411–414 are logic "H", the output signals S411–S414 are inverted to logic "L" and output in the OR circuits 301–304. In other words, since the input data signal from the terminal 325 changes "1→0→1", the output signals S301–S304 from the respective output terminals of the OR circuit 301–304 are delayed and output such as "0→1→0", solely depending on the data DATA from the data input terminal 325.

On the contrary, since output signals S411–S414 are all logic "H", the output signals S311–S314 from the respective output terminals of the AND circuits 311–314 change as "0→1→0", with some delay, solely depending on the data DATA from the data input terminal 325.

The respective signals S301–S304 are output from the OR circuits 301–304 in the sequence of "0→1→0", and are applied to the gates of the P channel MOS transistors 1–4, respectively. Therefore, all of the P channel MOS transistors 1–4 turn "on→off→on". The respective signals S311–S314 are output from the AND circuits 311–314 in the sequence of "0→1→0", and they are applied to the gates of N channel MOS transistors 11–14. Alternatively, all of the N channel MOS transistors 22–14 turn "off→on→off". Hence, as shown at the bottom of FIG. 11A, the output terminal 135 outputs the signal OUT whose logic is "H"→"L"→"H".

As explained above, when the output signals S311–S314 change from logic "L" to logic "H", the output signal OUT is output to the output terminal 135 with the delay time t1, which is the delay time when all the N channel MOS transistors 11–14 turn on. When the output signals S301–S304 change from logic "H" to logic "L", the output signal OUT is output from the output terminal 135 with a rise delay time t2, which is the delay time when all of the P channel MOS transistors 1–4 turn on.

In this manner, when the output signals D1–D4 are set to "1, 1, 1, 1", the data signal DATA input to the data input terminal 325 is inverted and output from the output terminal 135 with a fall delay time t1 and a rise delay time t2.

The timing chart of FIG. 11B is explained below using an example where the control signals D1–D4 are set to "0, 1, 1, 1". It is assumed that the data signal DATA input to the data input terminal 325 changes as "0→1→0", that is, as logic "L"→logic "H"→logic "L". The control signals D2–D4 are logic "H", and D1 is logic "L". The output signals S302–S304 from the respective output terminals of the OR circuit 302–304 change as "0→1→0" with some delay, solely depending on the data DATA from the data input terminal 325. On the contrary, since the control signal D1 is logic "L", the output S301 from the OR circuit 301 is always logic "H".

In the AND circuits 311–314, the control signals D2–D4, which are input to the input terminals 322–324, are logic "H", and D1 is logic "L". Thus the output signals S312–S314 from the respective output terminals of the AND circuits 312–314 change as "0→1→0" with some delay, solely depending on the input from the data input terminal 325. On the contrary, since the control signal D1 is logic "L", the output S311 from the AND circuit 311 is always logic "L".

The respective output signals S302–S304, which are output from the OR circuits 302–304, change as "0→1→0". The output signals S302–S304 are applied to the gates of the P channel MOS transistors 2–4. Therefore, the P channel MOS transistors 2–4 turn "on→off→on". On the contrary, whatever data signal DATA applied to the data input terminal 325 is, the P channel MOS transistor 1 is off, since the output S301 of the OR circuit 301 is always logic "H".

The respective output signals S312–S314 from the AND circuits 312–314 change as "0→1→0", and is applied to the gates of the N channel MOS transistors 12–14. The N channel MOS transistors 12–14 turn "off→on→off". On the contrary, since the output S311 of the AND circuit 311 is always logic "L", the N channel MOS transistor 11 is always off. Therefore, as illustrated in the lowest section of FIG. 11B, the output terminal 135 outputs the output signal OUT, which changes logic "H"→logic "L"→logic "H", according to the change output from the AND circuits 312–314.

As the output signals S312–S314 change from logic "L" to logic "H", the output terminal 135 outputs the signal OUT, which changes from logic "H" to logic "L", with the delay t1+Δt1 which occurs when the N channel MOS transistors 12–14 turn on. Similarly, when the output signals S302–S304 change from logic "H" to logic "L", the output terminal 135 outputs the output signal OUT, which changes from logic "L" to logic "H", with the delay t2+Δt2 which occurs when the P channel MOS transistors 2–4 turn on.

In this manner, when the control signals D1–D4 are set to "0, 1, 1, 1", the data signal DATA input to the data input terminal 325 are inverted and output from the output terminal 135 with the fall delay time t1+Δt1 and the rise delay time t2+Δt2.

In FIG. 11C, the control signals D1–D4 are set to "1, 0, 1, 1", and the data signal DATA input to the data input terminal 325 is inverted and output from the output terminal 135 with the delay time t1+2Δt1 and t2+2Δt2. On the contrary, in FIG. 11D, the control signals D1–D4 are set to "1, 0, 0, 0", and the data signal DATA input to the data input terminal 325 is inverted and output from the output terminal 135 with the delay time t1+14Δt1 and t2+14Δt2.

In the fourth embodiment as well as in the third embodiment, since the gate widths of the respective transistors are formed according to the ratio 1:2:4:8, it is possible to digitally vary the delay time minutely, using the unit delay times Δt1 and Δt2. Therefore, the present invention can solve the problem of the conventional variable delay circuit that the minimum delay time can not be shorter than the predetermined delay time. Moreover, it is possible in the present invention to meet the set-up time or hold time within the strict standard range resulting from the rise in operation frequency.

The circuit according to the fourth embodiment has superior operability to that of the third embodiment, since the memory 400 is set to control the data only once, at the beginning of the circuit operation. Although four stages of the P channel MOS transistors and four stages of the N channel MOS transistors are used in the explanation of the present circuit, the same kind of effect can be obtained in a circuit with more or fewer stages.

Embodiment 5

Figure 12:
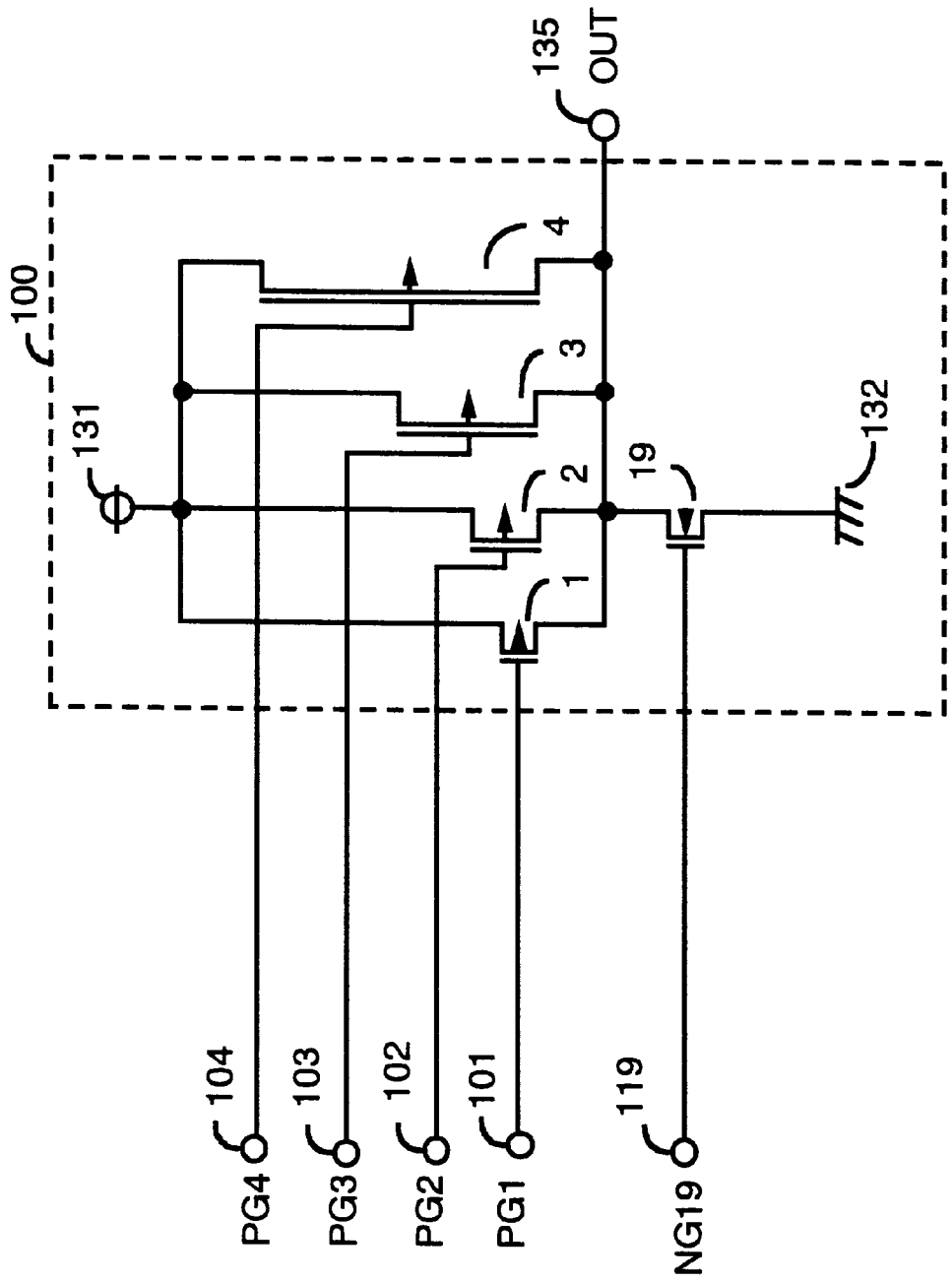
FIG. 12 shows a variable delay circuit according to a fifth embodiment of the present invention.

A fifth embodiment of the present invention is explained below. FIG. 12 shows a basic construction of the variable delay circuit according to the fifth embodiment. The variable delay circuit of FIG. 12 comprises a plurality of P channel MOS transistors 1–4. The respective P channel MOS transistors 1–4 have different gate widths, and they are connected in parallel. The gate widths W ratio of the P channel MOS transistors 1–4 are m, 2m, 4m, and 8m (m=desired number), respectively.

The gates of the P channel MOS transistors 1–4 are respectively connected to the input terminals 101–104, the drains are connected to the output terminal 135, and the sources are connected to the power supply VDD 131. The output terminal 135 is connected to the drain of an N channel MOS transistor 19, the source of the N channel MOS transistor 19 is connected to the ground 132, and the gate is connected to the data input terminal 325. The detailed constructions of the P channel MOS transistors 1–4 of FIG. 12 are the same as those of FIG. 2 and FIG. 3 explained in relation to the first embodiment, so that repeated explanation is omitted.

Figure 13:
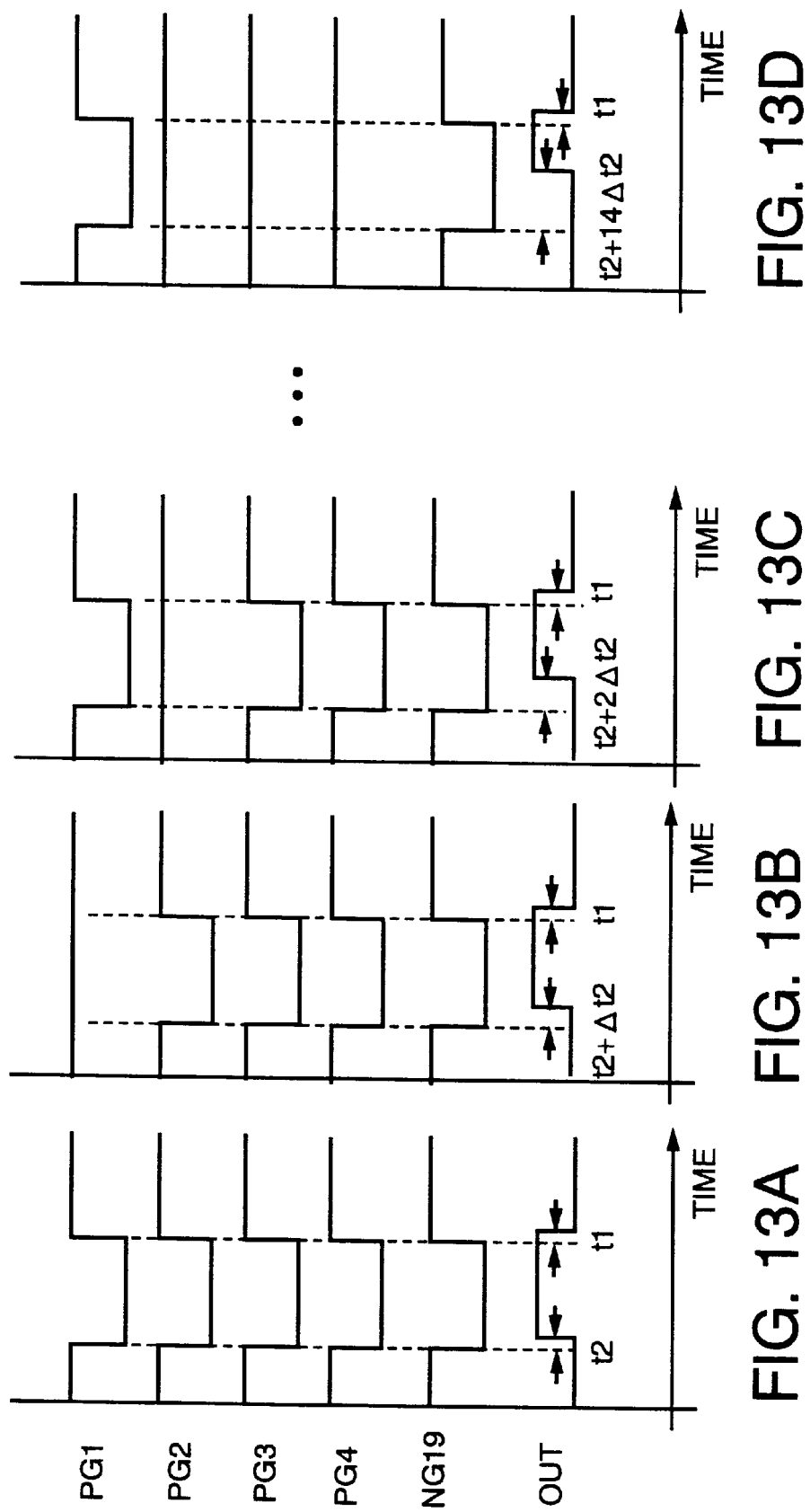
FIGS. 13A–13D are timing charts showing the operation of the variable delay circuit according to the fifth embodiment of the present invention.

The operation of the variable delay circuit of FIG. 12 is explained below. FIGS. 13A–13D are timing charts illustrating the operation of the variable delay circuit according to the present invention of FIG. 12. FIG. 13A shows a case where the input terminals 101–104 and 119 are supplied with the control signals PG1–PG4 and NG19, which change as logic "H"→logic "L"→logic "H", to operate all of the P channel MOS transistors 1–4 as "off→on→off". When the input data signals input to the input terminals 101–104 and 119 change as logic "H"→logic "L"→logic "H", the output signal from the output terminal 135 changes as logic "L"→logic "H"→logic "L".

Since all the P channel MOS transistors 1–4 are connected in parallel in FIG. 13A, the sum of the gate widths is W+2W+4W+8W=15W, and this is the largest gate width combination possible. This means that the delay time at this time is the shortest possible. That is, the waveform, having the fall delay time t1 and the rise delay time t2, reversed from the input waveform, is output from the output terminal 135.

FIG. 13B illustrates the delay characteristic when the data signals (PG2–PG4 and NG19) changing as logic "H"→logic "L"→logic "H" are input to the input terminals 102–104 and 119. The input data (PG1) having logic "H", which is a fixed voltage, are supplied to the input terminal 101, and then the P channel MOS transistor 1 is always off. Since the input data signals supplied to the input terminals 102–104 and 119 change as logic "H"→logic "L"→logic "H", the output signal OUT of the output terminal 135 changes as logic "L"→logic "H"→logic "L". The sum of the gate widths of the transistors 2–4 is 2W+4W+8W=14W. Since this sum of the gate widths is smaller by W than that of the transistors of FIG. 13A, the delay time is longer by Δt2 than that of FIG. 13A when the output signal is rising.

Therefore, the inverted waveform, having the rise delay time t2+Δt2 delayed from the input signal, and the fall delay time t1 delayed from the input signal, is output from the output terminal 135. The fall delay time t1 is determined by the delay time when the N channel MOS transistor 19 is on, and this fall delay time t1 is not influenced by the P channel MOS transistors 1–4.

FIG. 13C illustrates the delay characteristic when the data signals (PG1, PG3, PG4 and NG19) changing as logic "H"→logic "L"→logic "H" are input to the input terminals 101, 103, 104 and 119 . The input data (PG2) having logic "H", which is a fixed voltage, are supplied to the input terminal 102, and then the P channel MOS transistor 2 is always off. Since the input data signals supplied to the input terminals 101, 103, 104, and 119 change as logic "H"→logic "L"→logic "H", the output signal OUT of the output terminal 135 changes as logic "L"→logic "H"→logic "L". The sum of the gate widths of the transistors 1, 3, and 4 is W+4W+8W=13W. Since this sum of the gate widths is smaller by 2W than that of the transistors of FIG. 13A, the delay time is longer by 2Δt2 than that of FIG. 13A when the output signal is rising.

Therefore, the inverted waveform, having the rise delay time t2+2Δt2 delayed from the input signal, and the fall delay time t1 delayed from the input signal, is output from the output terminal 135. The fall delay time t1 is determined by the delay time when the N channel MOS transistor 19 is on, and this fall delay time t1 is not influenced by the P channel MOS transistors 1–4.

FIG. 13D illustrates the delay characteristic when the data signals (PG1, and NG19) changing as logic "H"→logic "L"→logic "H" are input to the input terminals 101 and 119. The input data (PG2, PG3, PG4) having logic "H", which are fixed voltages, are supplied to the input terminals 102, 103, 104, and then the P channel MOS transistors 2–4 are always off. Since the input data signals supplied to the input terminals 101 and 119 change as logic "H"→logic "L"→logic "H", the output signal OUT of the output terminal 135 changes as logic "L"→logic "H"→logic "L". The sum of the gate widths of the transistors 1 is W. Since this sum of the gate widths is the smaller by 14W than that of the transistors of FIG. 13A, the delay time is longer by 14Δt2 than that of FIG. 13A when the output signal is rising.

Therefore, the inverted waveform, having the rise delay time t2+14Δt2 delayed from the input signal, and the fall delay time t1 delayed from the input signal, is output from the output terminal 135. The fall delay time t1 is determined by the delay time when the N channel MOS transistor 19 is on, and this fall delay time t1 is not influenced by the P channel MOS transistors 1–4.

In this manner, in the fifth embodiment, it is possible to change the delay time Δt2, using the P channel MOS transistors 1–4 having different gate widths, and N channel MOS transistor 19. Moreover, the variable delay circuit of the present invention is able to adapt to the strict standard for the set-up time and hold time restricted by the rise in operation frequency. In the above explanation of the present circuit, the P channel MOS transistors are present in four stages. However, the same effect can be obtained with more or fewer stages.

In this fifth embodiment, as illustrated in FIGS. 13A–13D, it is possible to change only the rise delay time of the output signal OUT without changing the fall delay time t1, by combining the P channel MOS transistors 1–4 having various gate widths. That is, it is possible to realize a variable pulse width circuit producing pulse ends that are aligned, by controlling only the rise delay time t2.

Embodiment 6

Figure 14:
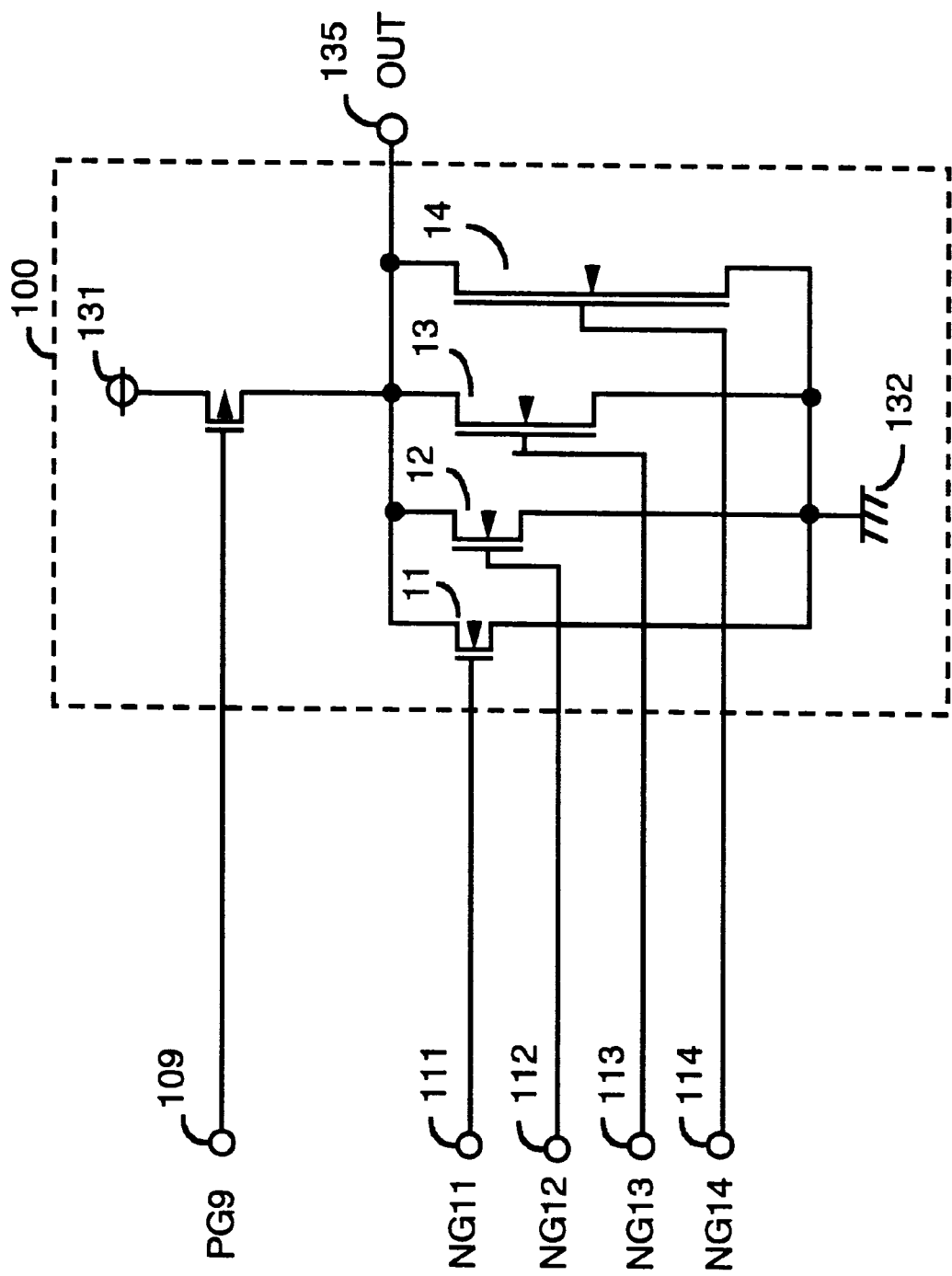
FIG. 14 shows a variable delay circuit according to a sixth embodiment of the present invention.

A sixth embodiment of the present invention is explained below. FIG. 14 shows a basic construction of the variable delay circuit according to the sixth embodiment. The variable delay circuit of FIG. 14 comprises a plurality of N channel MOS transistors 11–14. The respective N channel MOS transistors 11–14 have different gate widths, and they are connected in parallel. The gate width ratio W of the N channel MOS transistors 11–14 are n, 2n, 4n, 8n (n=desired number), respectively. The gates of the N channel MOS transistors 11–14 are respectively connected to the input terminals 111–114, their drains are connected to the output terminal 135, and their sources are connected to the ground 132.

The output terminal 135 is connected to the drain of a P channel MOS transistor 9, the source of the P channel MOS transistor 9 is connected to the power supply VDD 131, and the gate is connected to the input terminal 109. The detailed constructions of the N channel MOS transistors 11–14 of FIG. 14 are the same as those of FIG. 2 and FIG. 3 explained in relation to the first embodiment, so that a repeated explanation is omitted.

The operation of the variable delay circuit of FIG. 14 is explained below. FIGS. 15A–15D are timing charts illustrating the operation of the variable delay circuit according to the present invention of FIG. 14. FIG. 14A shows a case where the input terminals 111–114 and 109 are supplied with data signals NG11–NG14 and PG9 which change as logic "H"→logic "L"→logic "H", and all of the N channel MOS transistors 11–14 turn "on→off→on". When the input data signals input to the input terminals 111–114 and 109 change as logic "L"→logic "H"→logic "L", the output signal from the output terminal 135 changes as logic "H"→logic "L"→logic "H".

Figure 15:
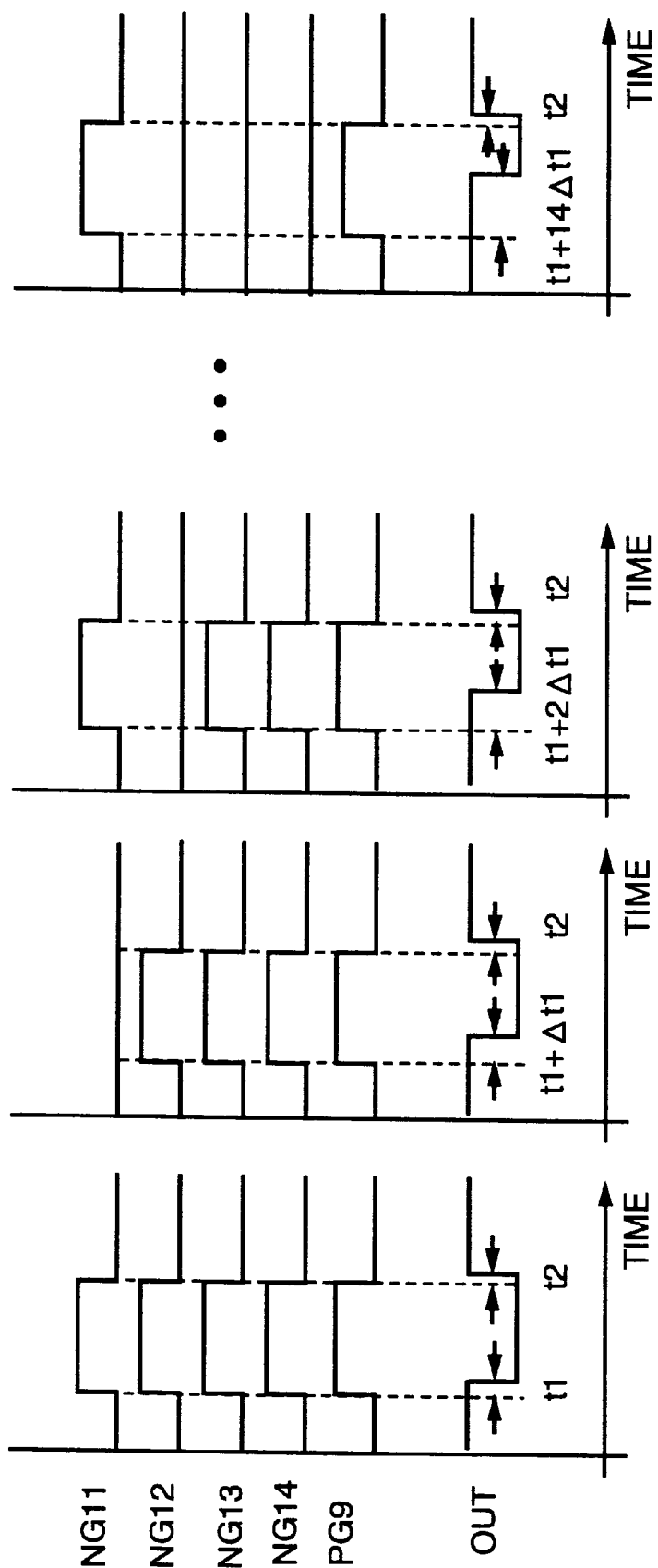
FIGS. 15A–15D are timing charts showing the operation of the variable delay circuit according to the sixth embodiment of the present invention.

Since the N channel MOS transistors 11–14 are all connected in parallel in FIG. 15A, the sum of the gate widths of the respective transistors 11–14 is W+2W+4+8W=15W, and this is the largest gate width combination possible. This means that the delay time is the shortest possible. In this case, the waveform, having the fall delay time t1 and the rise delay time t2, reversed from the input waveform is output from the output terminal 135.

FIG. 15B illustrates the characteristic of the delay when the input terminals 112–114 and 109 are supplied with the data signals (NG12–NG14 and PG9) which change as logic "L"→logic "H"→logic "L". The input terminal 111 is supplied with a signal (NG11) having logic "L", which is a fixed voltage; therefore, N channel MOS transistor 11 is always off. Since the input data signals applied to the input terminals 112–114 and 109 change as logic "L"→logic "H"→logic "L", the output signal OUT of the output terminal 135 changes as logic "H"→logic "L"→logic "H". The sum of the gate widths of the respective transistors 112–114 is 2W+4W+8W=14W.

Since this sum is smaller by W than that of the transistors in FIG. 15A, the delay time is longer by Δt1 than that of FIG. 15A. Therefore, the inverted waveform, having the rise delay time t1+Δt1 delayed from the input signal, and the rise delay time t2 delayed from the input signal, is output from the output terminal 135.

FIG. 15C illustrates the characteristic of the delay when the input terminals 111, 113, 114, and 109 are supplied with the data signals changing as logic "L"→logic "H"→logic "L". The input terminal 112 is supplied with a signal having logic "L" (NG12),which is a constant voltage; therefore, N channel MOS transistor 12 is always off. The sum of the gate widths of the respective transistors 111, 113, and 114 is W+4W+8W=13W.

Since this sum is smaller by 2W than that of the transistors of FIG. 15A, the rise delay time is longer by 2Δt1 than that of FIG. 15A. Therefore, the output terminal 135 outputs an inverted waveform having the rise delay time t1+2Δt1 delayed from the input signal, and the fall delay time t2 delayed from the input signal.

FIG. 15D illustrates the characteristic of the delay when only the input terminals 112–114 are supplied with a signal having logic "L", and, therefore, N channel MOS transistors 12–14 are always off. The sum of the gate widths is W, by only the N channel MOS transistor 11. Since this sum of the gate widths is the smaller by 14W than that of the transistors of FIG. 15A, the delay time is longer by 14Δt1 than that of FIG. 15A when the output signal is falling. Therefore, the output terminal 135 outputs the inverted waveform having the fall delay time t1+14Δt1 delayed from the input signal, and the rise delay time t2 delayed from the input signal.

In this manner, in the sixth embodiment, it is possible to change the delay time Δt1 by using the N channel MOS transistors 11–14 having different gate widths W and P channel MOS transistor 9. Moreover, the variable delay circuit of the present invention is able to adapt to the strict standard for the set-up time and hold time restricted by the rise in operation frequency. In the above explanation of the present circuit, the N channel MOS transistors are present in four stages. However, the same effect can be obtained with more or fewer stages.

In this sixth embodiment, as illustrated in FIGS. 15A–15D, it is possible to change only the fall delay time t1 of the output signal OUT without changing the rise delay time t2, by combining the N channel MOS transistors 11–14 having various gate widths. That is, it is possible to realize a variable pulse width circuit producing aligned pulse ends, by controlling the fall delay time t1. Moreover, since the pulse width changes according to the gate width W, it is possible to obtain a variable delay circuit which operates at higher speed by making the unit delay time short.

Embodiment 7

Figure 16:
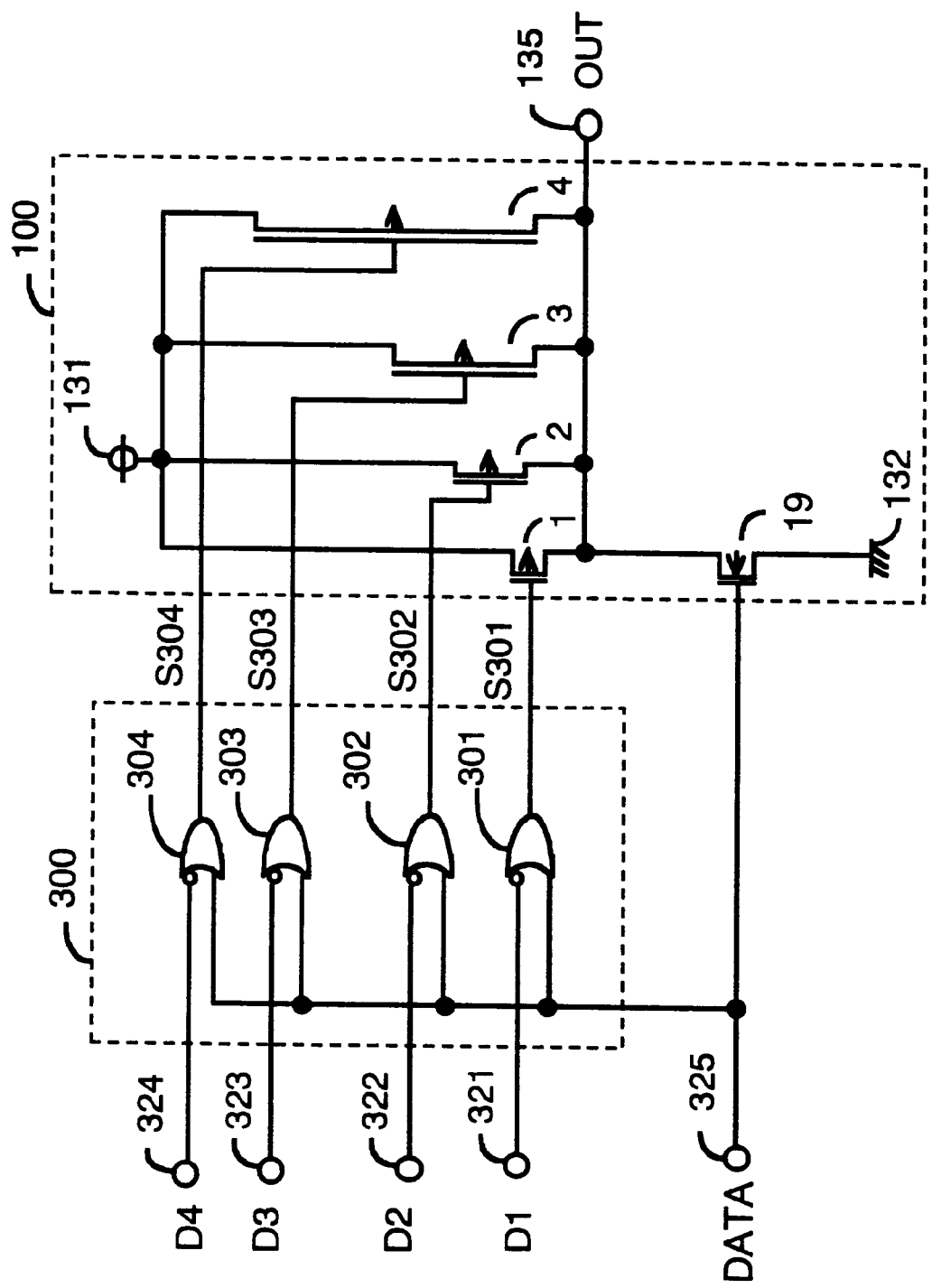
FIG. 16 shows a variable delay circuit according to a seventh embodiment of the present invention.

FIG. 16 shows a variable delay circuit according to a seventh embodiment of the present invention. FIG. 16 illustrates a variable delay circuit comprising the variable delay circuit 100 of FIG. 12 and a selector 300. In FIG. 16, the variable delay circuit 100 is the same as that of FIG. 12, therefore its explanation is omitted. The selector 300 comprises OR circuits 301–304, having inverting and non-inverting terminals, and their output terminals are respectively connected to the gates of the P channel MOS transistors 1–4. The respective inverting terminals of the OR circuits 301–304, which are located inside the selector 300, are connected to the input terminals 321–324, and the respective non-inverting terminals are connected to an input data terminal 325.

The output terminal 135 is connected to the drain of an N channel MOS transistor 19, the source of the N channel MOS transistor 19 is connected to the ground 132, and the gate is connected to the data input terminal 325. The detailed constructions of the P channel MOS transistors 1–4 of FIG. 16 are the same as those of FIG. 2 and FIG. 3 explained in relation to the first embodiment, therefore its explanation is omitted.

FIGS. 17A–17D are timing charts illustrating the operation of the variable delay circuit of FIG. 16. In FIGS. 17A–17D, control signals D1–D4 are input to the input terminals 321–324, respectively, which correspond to any of logic "H" or logic "L" indicated in hexadecimal. The data signal is input to the data input terminal 325 to operate the desired number of transistors in order to delay the data signal, input from outside of the circuit, for a desired period of time.

Figure 17:
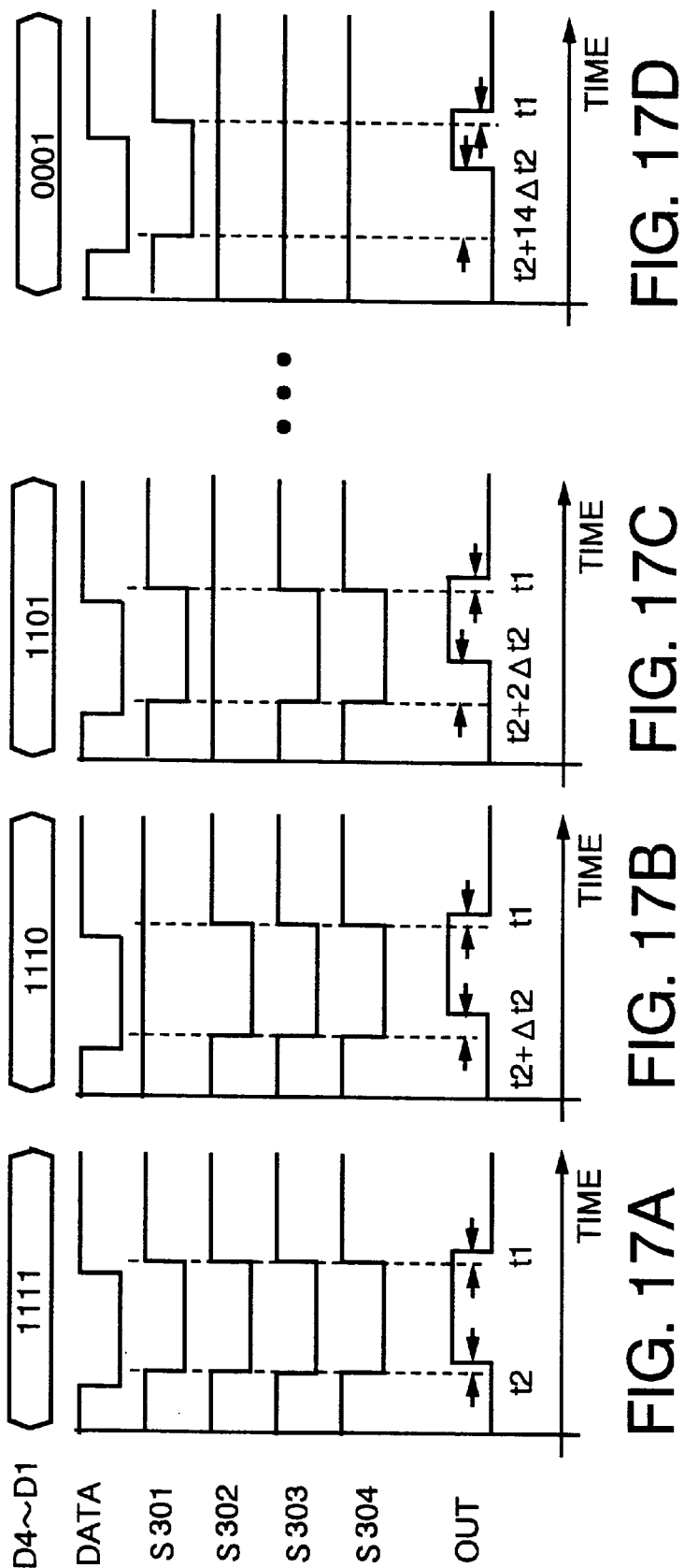
FIGS. 17A–17D are timing charts showing the operation of the variable delay circuit according to the seventh embodiment of the present invention.

In the example illustrated in the timing chart FIG. 17A, the control signals D1–D4 applied to the input terminals 321–324 are set to "1, 1, 1, 1". "1" indicates logic "H", and "0" indicates logic "L". It is also assumed that the data signal DATA input to the data input terminal 325 changes as "1→0→1", that is, as logic "H"→logic "L"→logic "H". Since the control signals D1–D4 input to the input terminals 321–324 are "1, 1, 1, 1", the logic "L" is output after the input data signals are inverted in the OR circuits 301–304. Thus, the output signals S301–S304 from the respective output terminals of the OR circuits 301–304 change as "1→0→1" with some delay time, solely depending on the data DATA from the data input terminal 325.

The respective signals S301–S304 are output from the OR circuits 301–304 in the sequence of "1→0→1", and they are applied to the gates of the P channel MOS transistors 1–4, respectively. Therefore, all of the P channel MOS transistors 1–4 turn "off→on→off". When the input data signal DATA input to the input terminals 325 changes as logic "H"→logic "L"→logic "H", the output signal from the output terminal 135 changes as logic "L"→logic "H"→logic "L".

Since all the P channel MOS transistors 1–4 are connected in parallel in FIG. 15A, the sum of the gate widths is W+2W+4W+8W=15W, and this is the largest gate width combination possible. This means that the delay time is the shortest possible. That is, the waveform, having the fall delay time t1 and the rise delay time t2, reversed from the input waveform is output from the output terminal 135.

In this manner, when the output signals D1–D4 are set to "1, 1, 1, 1", the data signal DATA input to the data input terminal 325 is inverted in the respective OR circuits, and is output to the output terminal 135 with the rise delay time t2 and the fall delay time t1.

The timing chart of FIG. 17B is explained below using an example where the control signals D1–D4 are set to "0, 1, 1, 1". It is assumed that the data signal DATA input to the data input terminal 325 changes as "1→0→1", that is, as logic "H"→logic "L"→logic "H". The control signals D2–D4 input to the input terminals 322–324 are logic "H", and D1 input to the input terminal 321 is logic "L". The output signals S302–S304 from the output terminals of the respective OR circuits 302–304 change as "1→0→1" with some delay, solely depending on the data DATA from the data input terminal 325. On the contrary, the output S301 from the OR circuit 301 is always logic "H", since the control signal D1 is logic "L".

The respective output signals S302–S304, which are output from the OR circuits 302–304, change as "1→0→1". The output signals S302–S304 are applied to the gates of the P channel MOS transistors 2–4. Therefore, the P channel MOS transistors 2–4 turn "off→on→off". On the contrary, whatever data signal DATA is applied to the data input terminal 325, the P channel MOS transistor 1 is off, since the output S301 of the OR circuit 301 is always logic "H".

Therefore, the output signal OUT from the output terminal 135 changes as logic "L"→logic "H"→logic "L", as illustrated at the bottom of FIG. 17B. When the output signals S302–S304 change from logic "H" to logic "L", the output signal OUT changes from logic "L" to logic "H". The output terminal 135 outputs this output signal OUT with the delay t2+Δt2 when the P channel MOS transistors 2–4 are on. When the data signal DATA changes from logic "L" to logic "H", the N channel MOS transistor 19 turns on, so the output terminal 135 outputs the data signal DATA with the fall delay time t1 delayed by the N channel MOS transistor.

In this manner, when the control signals D1–D4 are set to "0, 1, 1, 1", the data signal DATA input to the data input terminal 325 is inverted and output from the output terminal 135 with the rise delay time t2+Δt2 and the fall delay time t1.

FIG. 17C illustrates the delay characteristic when the control signals D1–D4 are input to the input terminals 321–324 as "1, 0, 1, 1", the data input terminal 325 is supplied with the input data signal changing as "1→0→1", that is, as logic "H"→logic "L"→logic "H", and the P channel MOS transistors 1, 3, and 4 operate as "off→on→off". The sum of the gate widths of the transistors 1, 3, and 4 when the transistors operate is W+4W+8W=13W.

Since this sum is smaller by 2W than that of the transistors in case of FIG. 17A, the delay time is longer by 2Δt2 than that of FIG. 17A when the output signal is rising. Therefore, the output terminal 135 outputs an inverted waveform having the rise delay time t2+2Δt2 delayed from the input signal, and the fall delay time t1 delayed from the input signal.

In the same manner, FIG. 17D illustrates the delay characteristic, when the input terminals 321–324 are supplied with the control signals D1–D4 which are set as "1, 0, 0, 0", the data input terminal 325 is supplied with the data signal DATA as "1→0→1", that is, as logic "H"→logic "L"→logic "H", and only the P channel MOS transistor 1 is activated. The sum of the gate width at this time is W, since only of the P channel MOS transistor 1 is activated. Since this width is smaller by 14W than that shown in case of FIG. 17A, the rise delay time becomes longer by 14Δt2 than that of the transistors in case of FIG. 17A. Therefore, the output terminal 135 outputs an inverted waveform having the rise delay time t2+14Δt2 delayed from the input signal, and the fall delay time t1 delayed from the input signal.

In this manner, in the seventh embodiment, it is possible to change the delay timeΔt2, by using only the P channel MOS transistors 1–4 having different gate widths W and N channel MOS transistor 19. Moreover, the variable delay circuit of the present invention is able to adapt to the strict standard for the set-up time and hold time restricted by the rise in operation frequency. In the above explanation of the present circuit, the P channel MOS transistors are present in four stages. However, the same effect can be obtained with more or fewer stages.

In this seventh embodiment, as illustrated in FIGS. 17A–17D, it is possible to change only the rise delay time t2 of the output signal OUT without changing the fall delay time t1, by combining the P channel MOS transistors 1–4 with different gate widths. That is, it is possible to realize a variable pulse width circuit producing a pulse with ends aligned, by controlling the rise delay time t2. Moreover, since the pulse width changes according to the gate width W, it is possible to obtain a variable delay circuit which operates at higher speed by making the unit delay time short.

Embodiment 8

Figure 18:
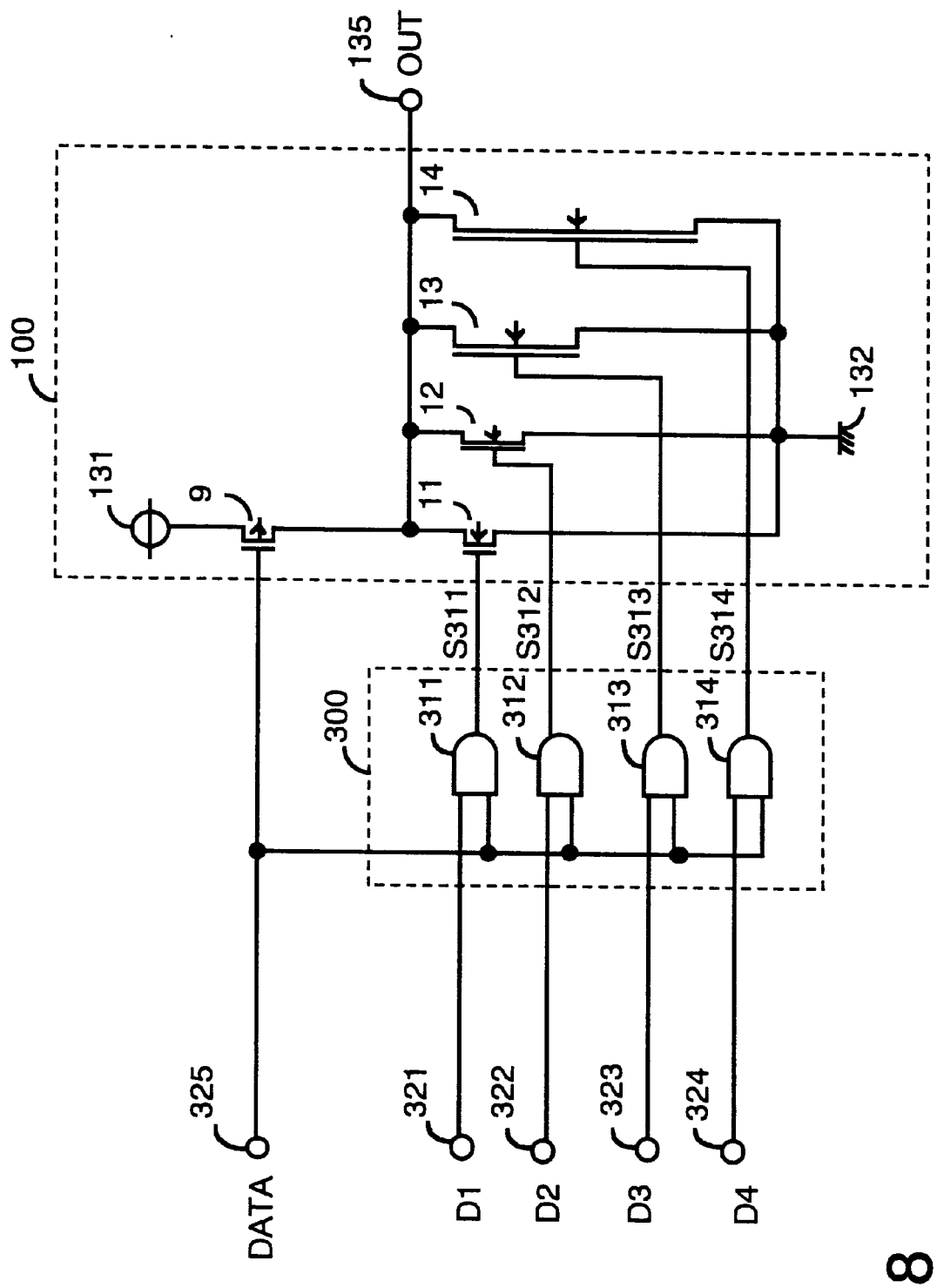
FIG. 18 shows a variable delay circuit according to an eighth embodiment of the present invention.

FIG. 18 shows a variable delay circuit according to an eighth embodiment of the present invention. FIG. 18 illustrates a variable delay circuit comprising the variable delay circuit 100 of FIG. 14 and a selector 300. In FIG. 18, the variable delay circuit 100 is the same as that of FIG. 14, therefore the explanation thereof is omitted. The selector 300 comprises AND circuits 311–314, and their output terminals are respectively connected to the gates of N channel MOS transistors 11–14.

One of the respective terminals of the AND circuits 311–314 located inside the selector 300, are connected to input terminals 321–324 and the other ends are connected to an input terminal 325 in common. The output terminal 135 is connected to the drain of a P channel MOS transistor 9, the source of the P channel MOS transistor 9 is connected to the power supply VDD 131, and the gate thereof is connected to the data input terminal 325. The detailed construction of the N channel MOS transistors 11–14 of FIG. 18 are the same as those of FIG. 2 and FIG. 3 explained in relation to the first embodiment; therefore, explanation thereof is omitted.

FIGS. 19A–19D are timing charts illustrating the operation of the variable delay circuit of FIG. 18. In FIGS. 19A–19D, control signals D1–D4 are input to the input terminals 321–324, respectively, which correspond to any of logic "H" or logic "L" indicated in hexadecimal. The data signal is input to the data input terminal 325 to operate the desired number of transistors in order to delay the data signal, input from the outside of the circuit, for a desired period of time.

Figures 19A, 19B, 19C, 19D:
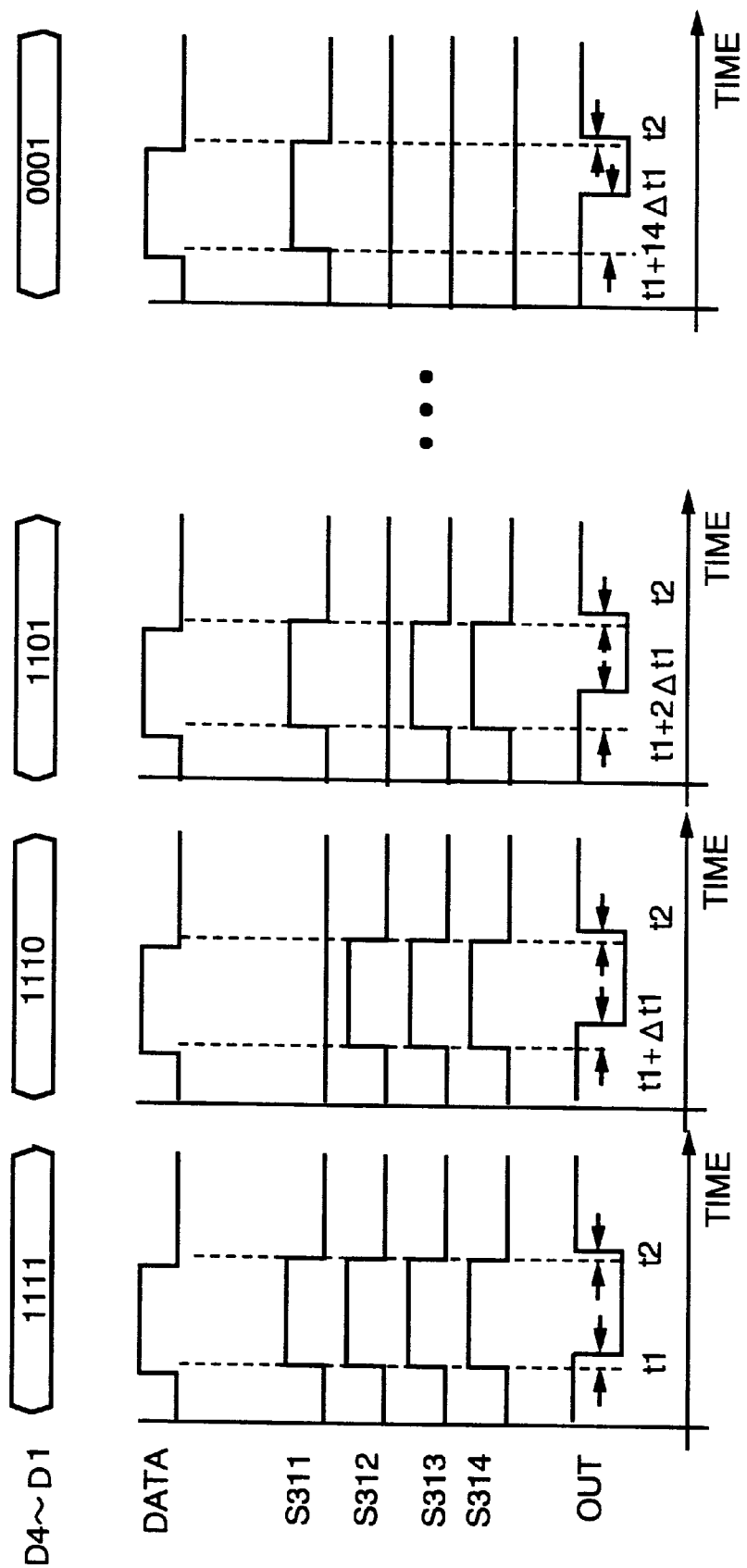
FIGS. 19A–19D are timing charts showing the operation of the variable delay circuit according to the eighth embodiment of the present invention.

For example, FIG. 19A illustrates a case where the control signals D1–D4 applied to the input terminals 321–324 are set to "1, 1, 1, 1". "1" indicates logic "H", and "0" indicates logic "L". It is also assumed that the data signal DATA input to the data input terminal 325 changes "0→1→0", that is, as logic "L"→logic "H"→logic "L". Since the control signals D1–D4 input to the input terminals 321–324 are logic "1, 1, 1, 1", the output signals S311–S314 change as "0→1→0" with some delay, solely depending on the data DATA from the data input terminal 325.

The respective output signals S311–S314 are output from the AND circuits 311–314 in the sequence of "0→1→0", and they are applied to the gates of the N channel MOS transistors 11–14, respectively. Therefore, all of the N channel MOS transistors 11–14 turn "off→on→off". Therefore, the output terminal 135 outputs the output signal OUT in the sequence of logic "H"→logic "L"→logic "H", as illustrated at the bottom of FIG. 19A.

The N channel MOS transistors 11–14 all turn on according to the change of the output signals S311–S314 from logic "L"→logic "H", then the output terminal 135 outputs the output signal OUT as logic "H"→logic "L" with the fall delay time t1. The N channel MOS transistors 11–14 turn off, at the same time the P channel MOS transistor 9 turns on when the data signal DATA at the data input terminal 325 and the output signals S311–S314 change from logic "H" to logic "L". The output terminal 135 outputs the output signal OUT as logic "L"→logic "H" with the delay time t2 when the P channel MOS transistor 9 turns on.

In this manner, when the output signals D1–D4 are set to "1, 1, 1, 1", the data signal DATA input to the data input terminal 325 is inverted and output from the output terminal 135 with the rise delay time t2 and the fall delay time t1.

FIG. 19B is explained below using an example where the control signals D1–D4 are set to "0, 1, 1, 1". It is assumed that the data signal DATA input to the data input terminal 325 changes as "0→1→0", that is, as logic "L"→logic "H"→logic "L". The control signals D2–D4 are logic "H", and D1 is logic "L". Therefore, these control signals S312–S314 from the respective output terminals of the AND circuits 312–314 change as "0→1→0" with some delay, solely depending on the data DATA from the data input terminal 325. On the contrary, the output S311 from the AND circuit 311 is always logic "L", since the control signal D1 is logic "L".

The respective output signals S312–S314, which are output from the AND circuits 312–314, change as "0→1→0". The output signals S312–S314 are applied to the gates of the N channel MOS transistors 12–14, therefore the N channel MOS transistors 12–14 turn "off→on→off". On the contrary, the output S311 of the AND circuit 311 is always logic "L. Therefore, the N channel MOS transistor 11 is always off without any influence from the data signal DATA applied to the data input terminal 325.

Therefore, as shown at the bottom of FIG. 19B, the output signal OUT of the logic "H"→logic "L"→logic "H" is output from the output terminal 135. The N channel MOS transistors 12–14 turn on according to the change of the output signals S312–S314 from logic "L"→logic "H", and the output terminal 135 outputs the output signal OUT changing as logic "H"→logic "L" with the falling delay t1+Δt1 when the N channel MOS transistors 12–14 turn on.

The N channel MOS transistors 11–14 turn off at the same time the P channel MOS transistor 9 turns on when the data signal DATA at the data input terminal 325 and the output signals S312–S314 change from the logic "H"→logic "L". Therefore the output terminal 135 outputs the output signal OUT changing as logic "L"→logic "H" with the rise delay time t2 which is influenced by the turning on of the P channel MOS transistor 9.

In this manner, when the output signals D1–D4 are set to "0, 1, 1, 1", the data signal DATA input to the data input terminal 325 is inverted and output to the output terminal 135 with the rise delay time t2 and the fall delay time t1+Δt1.

FIG. 19C illustrates the delay characteristic when the control signals D1–D4 are input to the input terminals 321–324 as "1, 0, 1, 1", the data input terminal 325 receives the input of the data signal as "0→1→0", that is, as logic "L"→logic "H"→logic "L", and the N channel MOS transistors 11, 13, and 14 operate as "off→on→off". The sum of the gate widths of the transistors 11, 13, and 14 when the transistors operate is W+4W+8W=13W.

Since this sum is smaller by 2W than that of the transistors in case of FIG. 19A, the delay time is longer by 2Δt1 than that of FIG. 19A when the output signal is falling. Therefore, the output terminal 135 outputs an inverted waveform having the fall delay time t1+2Δt1 delayed from the input signal and the rise delay time t2 delayed from the input signal.

In the same manner, FIG. 19D illustrates the delay characteristic when the input terminals 321–324 are supplied with the control signals D1–D4 as "1, 0, 0, 0", and the data input terminal 325 is supplied with a data signal changing as "0→1→0", that is, as logic "L"→logic "H"→logic "L", and only the N channel MOS transistor 11 is activated.

The sum of the gate width at this time is W, since only the N channel MOS transistor 11 is operating. Since this sum is smaller by 14W than in FIG. 19A, the fall delay time becomes longer by 14Δt1 than that of the transistors in FIG. 19A. Therefore, the output terminal 135 outputs the inverted waveform having the fall delay time t1+14Δt1 delayed from the input signal and the rise delay time t2 delayed from the input signal.

In this manner, in the eighth embodiment, it is possible to change the delay time Δt1, by using only the N channel MOS transistors 11–14 having different gate widths W, and P channel MOS transistor 9. Moreover, the variable delay circuit of the present invention is able to adapt to the strict standard for the set-up time and hold time restricted by the rise in operation frequency. In the above explanation of the present circuit, the N channel MOS transistors are present in four stages. However, the same effect can be obtained with more or fewer stages.

In this eighth embodiment, as illustrated in FIGS. 19A–19D, it is possible to change only the fall delay time t1 of the output signal OUT without changing the rising time t2, by combining the N channel MOS transistors 11–14 having various gate widths. That is, it is possible to realize a variable pulse width circuit whose pulse ends are aligned, by controlling the fall delay time t1.

Moreover, since the pulse width changes according to the gate width W, it is possible to obtain a variable delay circuit which operates at higher speed by making the unit delay time short.

Furthermore, the eighth embodiment is distinguished from the sixth embodiment in that the delay time can be easily controlled by inputting the data from outside of the circuit.

Embodiment 9

Figure 20:
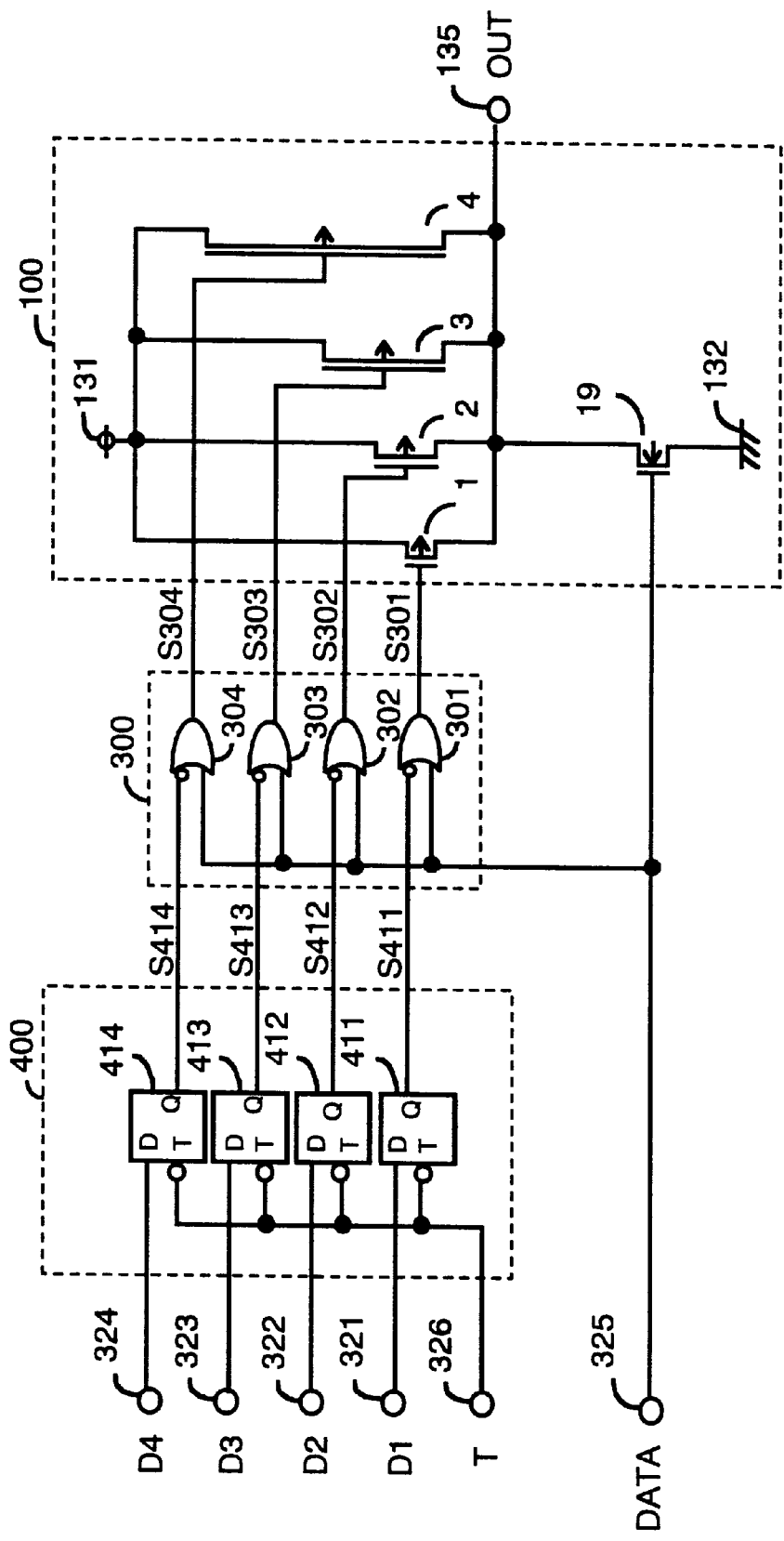
FIG. 20 shows a variable delay circuit according to a ninth embodiment of the present invention.

A ninth embodiment of the present invention is explained below. FIG. 20 includes a memory 400 in addition to the selector 300 and the variable delay circuit 100 of FIG. 16. In FIG. 20, since the variable delay circuit 100 and the selector 300 are the same as those of FIG. 16, the explanation thereof is omitted. The memory 400 comprises D flip-flops 411–414. The non-inverting D terminals of the flip-flops 411–414 are connected to the input terminals 321–324, respectively, and the inverting T terminals of the respective D flip-flops 411–414 are connected to the input terminal T 326. The output terminals Q of the D flip-flops 411–414 are connected to the inverting input terminals of the OR circuits 301–304 in the selector 300, respectively. The non-inverting terminals of the OR circuit 301–304 in the selector 300 are connected to the data input terminal 325.

FIGS. 21A–21D are timing charts illustrating the operation of the variable delay circuit of the present invention shown in FIG. 20. In FIGS. 21A–21D, fixed voltages corresponding to logic "H" or logic "L" identified in hexadecimal are input to the input terminals 321–324 as control signals D1–D4. At the same time, a set signal T is input to the T input terminal 326. The data signal is input to the data input terminal 325 to activate one or more desired transistors. In this manner, it is possible to control the data signal, which has been input from outside of the circuit, to obtain the desired delay time.

The memory 400 temporarily stores the control signals D1–D4, which are input from the input terminals 321–324, when the set signal T input to the T input terminal 326 changes from logic "H" to logic "L". This setting operation is performed only once at the beginning of the circuit operation to store the values of the control signals D1–D4 in the D flip-flops 411–414. After then, the variable delay circuit operates based on these values of the control signals D1–D4 stored in the D flip-flops 411–414.

Figure 21:
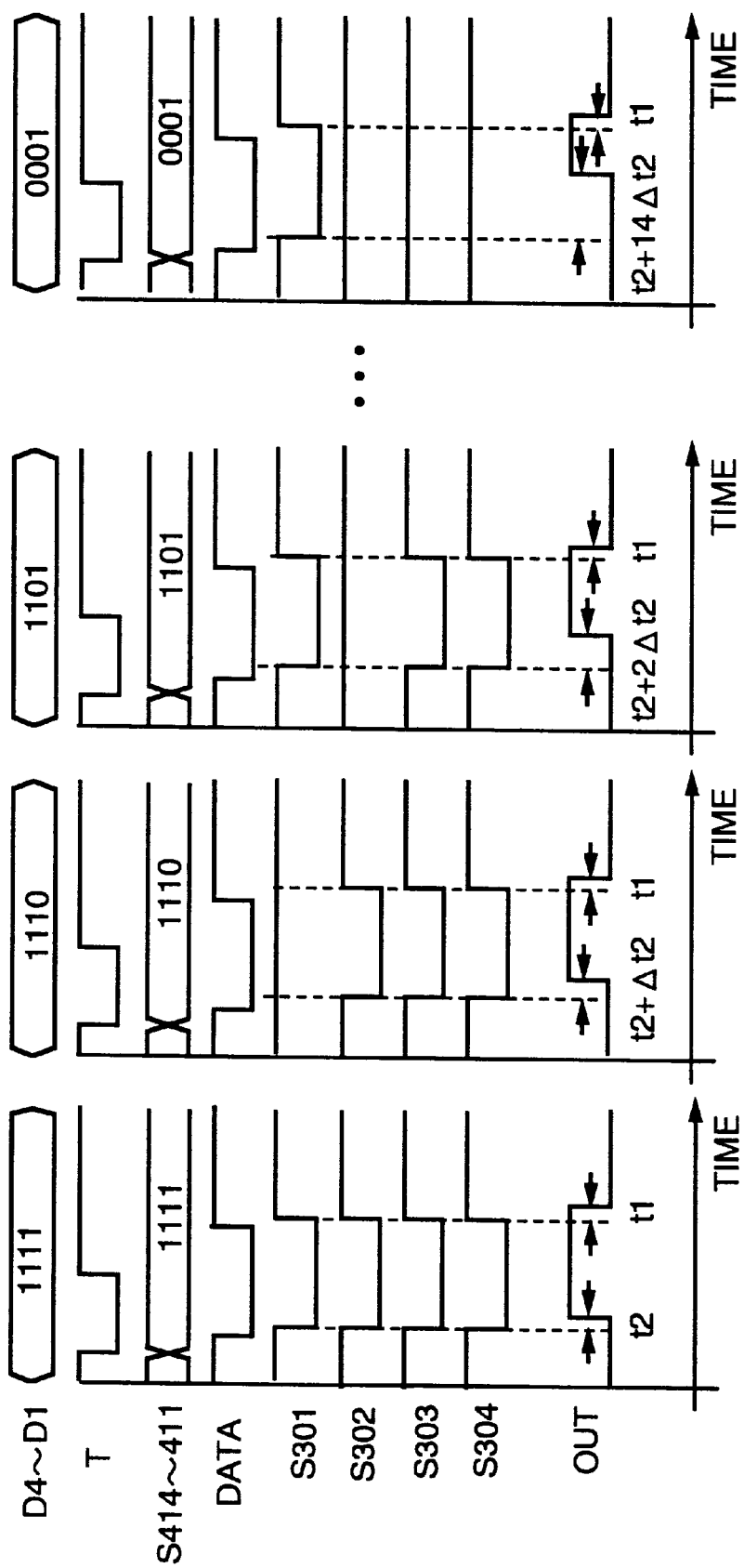
FIGS. 21A–21D are timing charts showing the operation of the variable delay circuit according to the ninth embodiment of the present invention.

For example, FIG. 21A illustrates a case where the control signals D1–D4 applied to the input terminals 321–324 are set to "1, 1, 1, 1". "1" indicates logic "H", and "0" indicates logic "L". It is assumed that the data signal DATA input to the data input terminal 325 changes as "1→0→1", that is, logic "H"→logic "L"→logic "H". Since all the output signals S411–S414 from the D flip-flops 411–414 are logic "H", the output signals S411–S414 are inverted to logic "L" and output to the OR circuits 301–304. In other words, since the input data signal from the terminal 325 changes "1→0→1", the output signals S301–S304 from the respective output terminals of the OR circuit 301–304 are delayed and output such as "1→0→1", solely depending on the data DATA from the data input terminal 325.

The respective signals S301–S304 are output from the OR circuits 301–304 in the sequence of "1→0→1", they are applied to the gates of the P channel MOS transistors 1–4, respectively. Therefore, all of the P channel MOS transistors 1–4 turn "off→on→off".

Hence, as shown at the bottom of FIG. 21A, the output terminal 135 outputs the signal OUT whose logic is "L"→"H"→"L". When the output signals S301–S304 changes from logic "H" to logic "L", the output signal OUT is output from the output terminal 135 with the rise delay time t2, which is the delay time when all of the P channel MOS transistors 1–4 turn on. When the data signal DATA changes from logic "L" to logic "H", the N channel MOS transistor 19 turns on. Therefore the output terminal 135 outputs the data signal DATA with the fall delay time t1 delayed by the N channel MOS transistor.

In this manner, when the output signals D1–D4 are set to "1, 1, 1, 1", the data signal DATA input to the data input terminal 325 is inverted and output from the output terminal 135 with the fall delay time t1 and the rise delay time t2.

The timing chart of FIG. 21B is explained below using an example where the control signals D1–D4 are set to "0, 1, 1, 1". It is assumed that the data signal DATA input to the data input terminal 325 changes as "1→0→1", that is, as logic "H"→logic "L"→logic "H". The control signals D2–D4 are logic "H", and D1 is logic "L". The output signals S302–S304 from the respective output terminals of the OR circuit 302–304 change as "1→0→1" with some delay, solely depending on the data DATA from the data input terminal 325. On the contrary, since the control signal D1 is logic "L", the output S301 from the OR circuit 301 is always logic "H".

The respective output signals S302–S304, which are output from the OR circuits 302–304, change as "1→0→1". The output signals S302–S304 are applied to the gates of the P channel MOS transistors 2–4. Therefore, the P channel MOS transistors 2–4 turn "off→on→off". On the contrary, whatever data signal DATA applied to the data input terminal 325 is, the P channel MOS transistor 1 is off, since the output S301 of the OR circuit 301 is always logic "H".

Therefore, the output signal OUT from the output terminal 135 changes as logic "L"→logic "H"→logic "L", as illustrated at the bottom of FIG. 21B. When the output signals S302–S304 change from logic "H" to logic "L", the output signal OUT changes from logic "L" to logic "H". The output terminal 135 outputs this output signal OUT with the delay t2+Δt2 when the P channel MOS transistor 2–4 is on. When the data signal DATA changes from logic "L" to logic "H", the N channel MOS transistor 19 turns on. Therefore, the output terminal 135 outputs the data signal DATA with the fall delay time t1 delayed by the N channel MOS transistor 19.

In this manner, when the control signals D1–D4 are set to "0, 1, 1, 1", the data signal DATA input to the data input terminal 325 is inverted and output from the output terminal 135 with the rise delay time t2+Δt2 and the fall delay time t1.

FIG. 21C illustrates the delay characteristic when the control signals D1–D4 are input to the input terminals 321–324 as "1, 0, 1, 1", the data input terminal 325 is supplied with the input data signal changing as "1→0→1", that is, as logic "H"→logic "L"→logic "H", and the P channel MOS transistors 1, 3, and 4 operate as "off→on→off".

The sum of the gate widths of the transistors 1, 3, 4 is W+4W+8W=13W. Since this sum of the gate widths is smaller by 2W than that of the transistors of FIG. 21A, the delay time is longer by 2Δt2 than that of FIG. 21A when the output signal is rising. Therefore, the inverted waveform, having the rise delay time t2+2Δt2 delayed from the input signal, and the fall delay time t1 delayed from the input signal, is output from the output terminal 135. The fall delay time t1 is determined by the delay time when the N channel MOS transistor 19 is on, and this fall delay time t1 is not influenced by the P channel MOS transistors 1–4.

In the same manner, FIG. 21D illustrates the delay characteristic, when the input terminals 321–324 are supplied with the control signals D1–D4 which are set as "1, 0, 0, 0", the data input terminal 325 is supplied with the data signal DATA as "1→0→1", that is, as logic "H"→logic "L"→logic "H", and only the P channel MOS transistor 1 is activated. The sum of the gate width at this time is W, since only of the P channel MOS transistor 1 is activated. Since this sum is smaller by 14W than that shown in case of FIG. 21A, the rise delay time becomes longer by 14Δt2 than that of the transistors in case of FIG. 21A. Therefore, the output terminal 135 outputs the inverted waveform having the rise delay time t2+14Δt2 delayed from the input signal, and the fall delay time t1 delayed from the input signal.

In this manner, in the ninth embodiment, it is possible to change the delay time Δt2, using the P channel MOS transistors 1–4 having different gate widths W, and N channel MOS transistor 19. Moreover, the variable delay circuit of the present invention is able to adapt to the strict standard for the set-up time and hold time restricted by the rise in operation frequency.

This circuit according to the ninth embodiment has superior operability to that of the seventh embodiment, since the memory 400 is set to control the data only once, at the beginning of the circuit operation. Although four stages of the P channel MOS transistors are used in the explanation of the present circuit, the same kind of effect can be obtained in a circuit with more or fewer stages.

Embodiment 10

Figure 22:
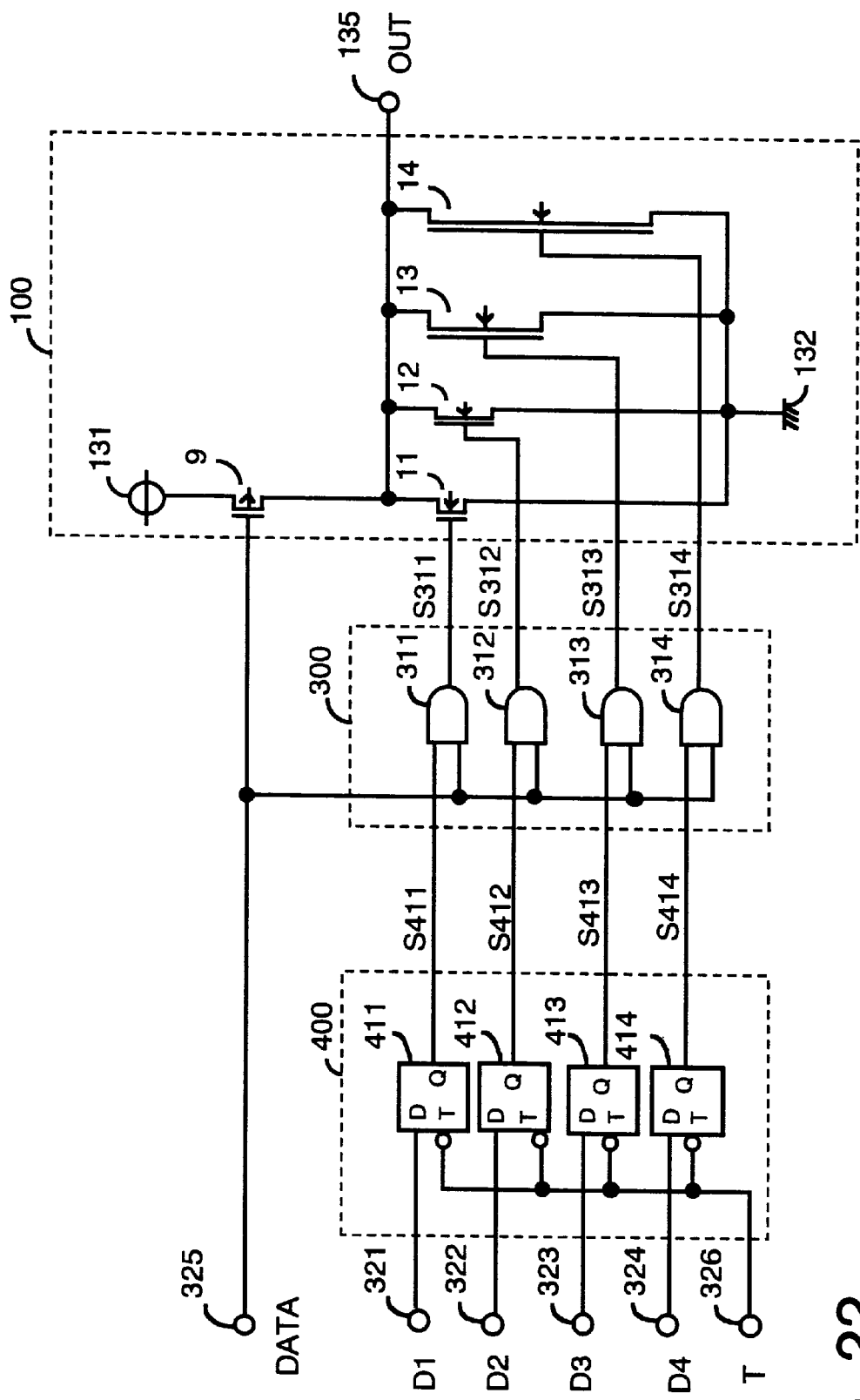
FIG. 22 shows a variable delay circuit according to a tenth embodiment of the present invention.

A tenth embodiment of the present invention is explained below. FIG. 22 includes a memory 400 in addition to the selector 300 and the variable delay circuit 100 of FIG. 18. In FIG. 22, the variable delay circuit 100 and the selector 300 are the same as those of FIG. 18, thus its explanation is omitted. The memory 400 comprises D flip-flops 411–414. The non-inverting D terminals of the flip-flops 411–414 are connected to the input terminals 321–324, respectively, and the inverting T terminals of the respective D flip-flops 411–414 are connected to the input terminal T 326. The output terminals Q of the D flip-flops 411–414 are connected to one of the input terminals of the AND circuits 311–314 in the selector 300, respectively. The non-inverting terminals of the AND circuit 311–314 in the selector 300 are connected to the data input terminal 325.

FIGS. 23A–23D are timing charts illustrating the operation of the variable delay circuit of the present invention shown in FIG. 22. In FIGS. 23A–23D, fixed voltages corresponding to logic "H" or logic "L", shown in hexadecimal, are input to the input terminals 321–324 as control signals D1–D4. At the same time, a set signal T is input to the T input terminal 326. The data signal is input to the data input terminal 325 to activate one or more desired transistors. In this manner, it is possible to control the data signal, which has been input from outside of the circuit, to obtain the desired delay time.

The memory 400 temporarily stores the control signals D1–D4, which are input from the input terminals 321–324, when the set signal T input to the T input terminal 326 changes from logic "H" to logic "L". This setting operation is performed only once at the beginning of the circuit operation to store the values of the control signals D1–D4 in the D flip-flops 411–414. After then, the variable delay circuit operates based on these values of the control signals D1–D4 stored in the D flip-flops 411–414.

Figures 23A, 23B, 23C, 23D:
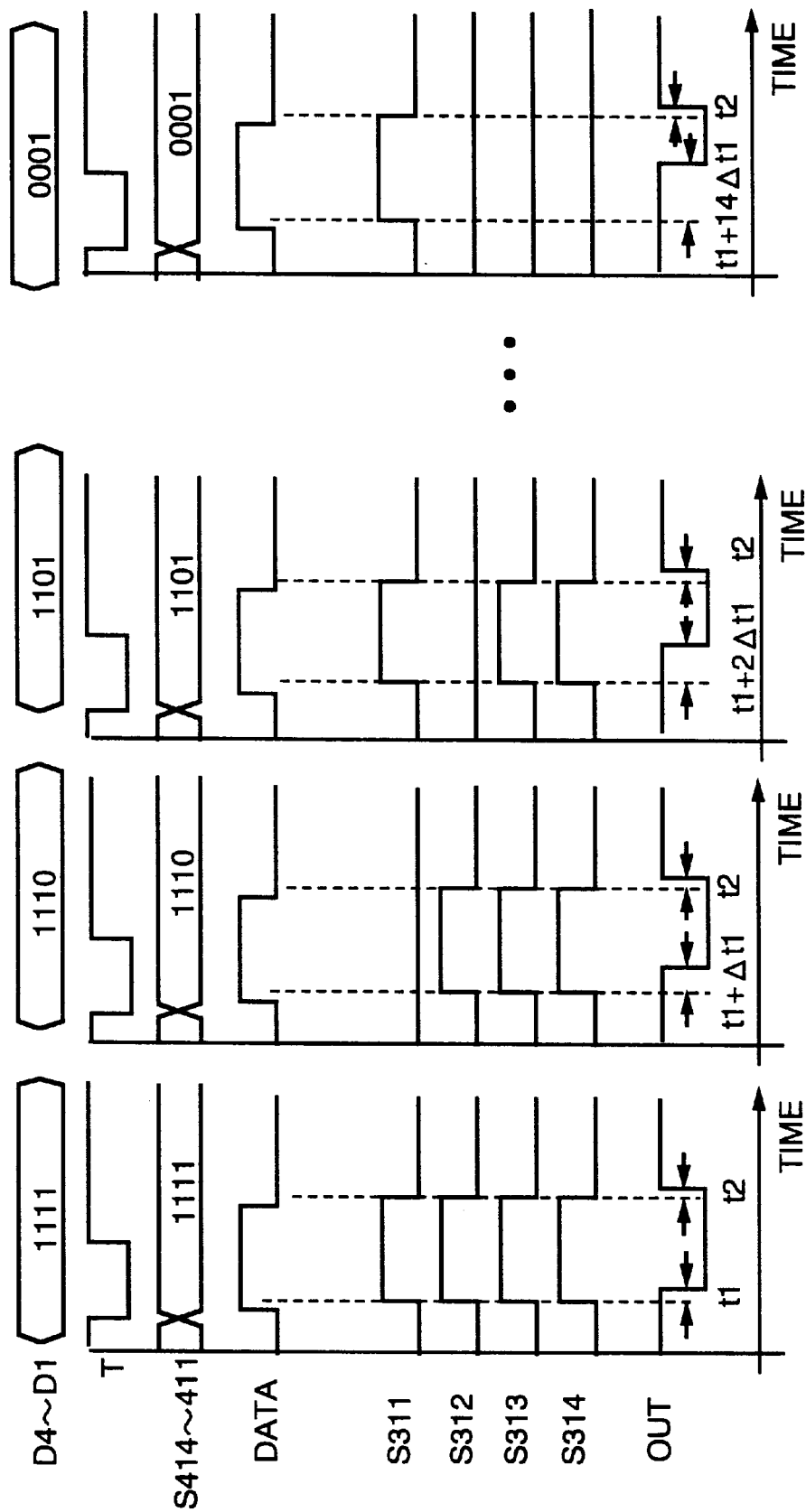
FIGS. 23A–23D are timing charts showing the operation of the variable delay circuit according the tenth embodiment of the present invention.
Figure 24:
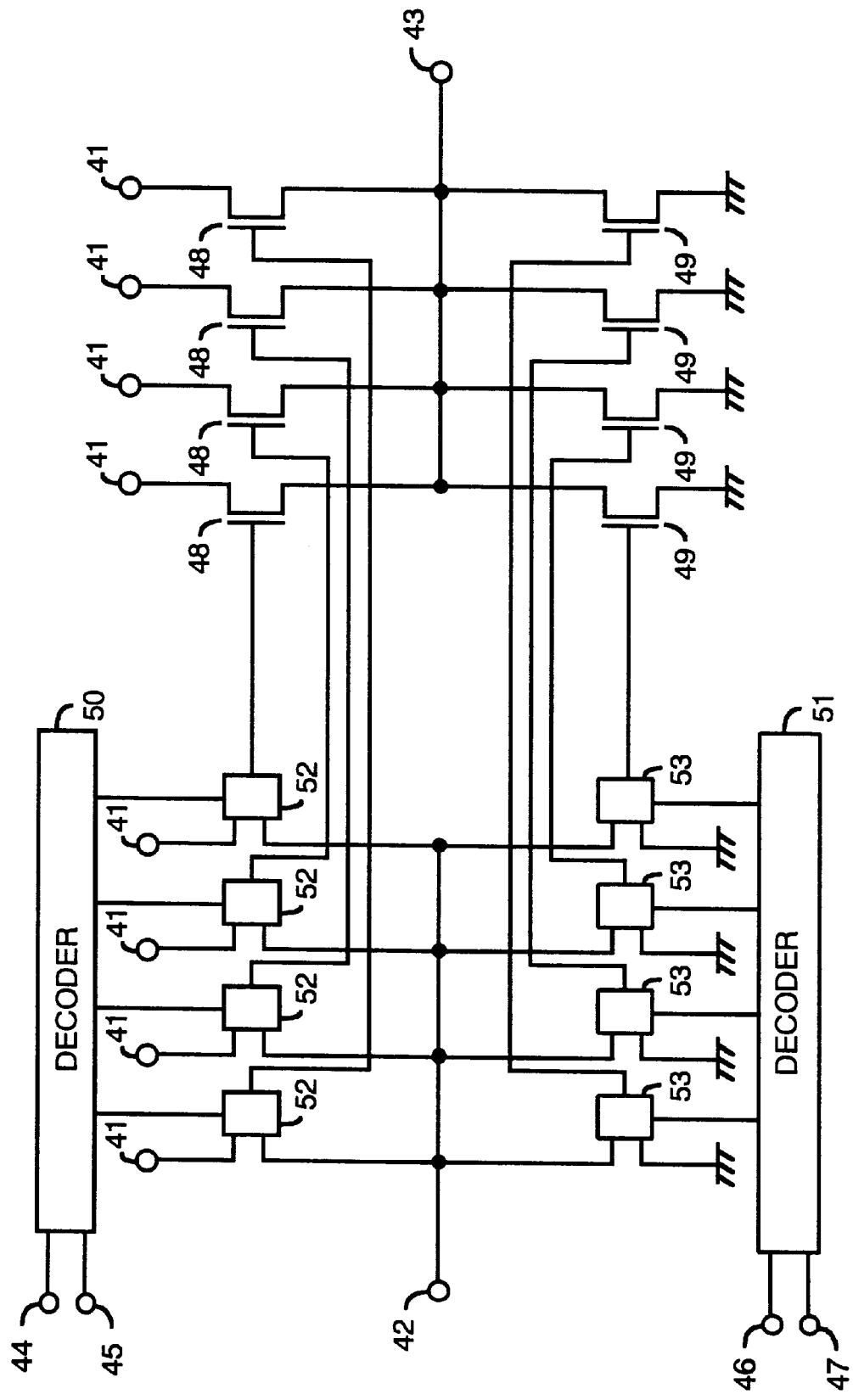
FIG. 24 shows a conventional variable delay circuit.
Figure 25:
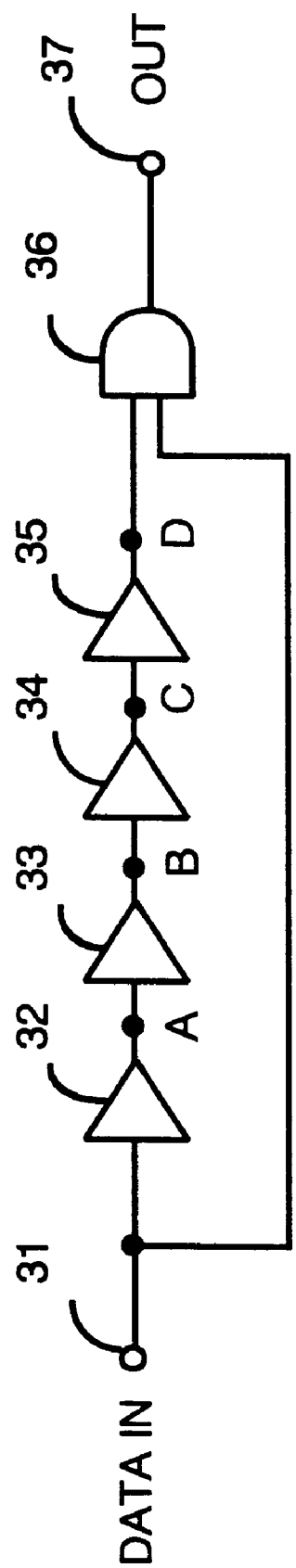
FIG. 25 shows a conventional variable delay circuit which is commonly used.

For example, FIG. 23A illustrates a case where the control signals D1–D4 applied to the D flip-flops 411–414 are set to "1, 1, 1, 1". "1" indicates logic "H", and "0" indicates logic "L". It is assumed that the data signal DATA input to the data input terminal 325 changes as "0→1→0", that is, as logic "L"→logic "H"→logic "L". Since all the output signals S411–S414 from the D flip-flops 411–414 are logic "H", the output signals S411–S414 output to the AND circuits 311–314. In other words, since the input data signal from the terminal 325 changes "0→1→0", the output signals S311–S314 from the respective output terminals of the AND circuit 311–314 are delayed and output such as "0→1→0", solely depending on the data DATA from the data input terminal 325.

The respective output signals S311–S314 are output from the AND circuits 311–314 in the sequence of "0→1→0", and they are applied to the gates of the N channel MOS transistors 11–14, respectively. Therefore, all of the N channel MOS transistors 11–14 turn "off→on→off". Therefore, the output terminal 135 outputs the output signal OUT in the sequence of logic "H"→logic "L"→logic "H", as illustrated at the bottom of FIG. 23A. The N channel MOS transistors 11–14 all turn on according to a change of the output signals S311–S314 from logic "L"→logic "H", then the output terminal 135 outputs the output signal OUT as logic "H"→logic "L" with the fall delay time t1.

The N channel MOS transistors 11–14 turn off at the same time the P channel MOS transistor 9 turns on when the data signal DATA at the data input terminal 325 and the output signals S311–S314 change from logic "H" to logic "L". The output terminal 135 outputs the output signal OUT as logic "L"→logic "H" with the delay time t2 when the P channel MOS transistor 9 turns on.

In this manner, when the output signals D1–D4 are set to "1, 1, 1, 1", the data signal DATA input to the data input terminal 325 is inverted and output from the output terminal 135 with the rise delay time t2 and the fall delay time t1.

FIG. 23B is explained below using an example where the control signals D1–D4 are set to "0, 1, 1, 1". It is assumed that the data signal DATA input to the data input terminal 325 changes as "0→1→0", that is, as logic "L"→logic "H"→logic "L". The control signals D2–D4 are logic "H", and D1 is logic "L". Therefore, these control signals S312–S314 from the respective output terminals of the AND circuits 312–314 change as "0→1→0" with some delay, solely depending on the data DATA from the data input terminal 325. On the contrary, the output S311 from the AND circuit 311 is always logic "L", since the control signal D1 is logic "L".

The respective output signals S312–S314, which are output from the AND circuits 312–314, change as "0→1→0". The output signals S312–S314 are applied to the gates of the N channel MOS transistors 12–14, therefore the N channel MOS transistors 12–14 turn "off→on→off". On the contrary, the output S311 of the AND circuit 311 is always logic "L", therefore, the N channel MOS transistor 11 is always off without any influence from the data signal DATA applied to the data input terminal 325.

Therefore, as shown at the bottom of FIG. 23B, the output signal OUT of the logic "H"→logic "L"→logic "H" is output from the output terminal 135. The N channel MOS transistors 12–14 turn on according to the change of the output signals S312–S314 from logic "L"→logic "H", and the output terminal 135 outputs the output signal OUT changing as logic "H"→logic "L" with the falling delay t1+Δt1 when the N channel MOS transistors 12–14 turn on. According to the change of the data signal DATA at the data input terminal 325 and the output signals S312–S314 from the logic "H"→logic "L", the output terminal 135 outputs the out signal OUT as logic "L"→logic "H" with the delay time t2 when the P channel MOS transistor 9 turns on.

In this manner, when the output signals D1–D4 are set to "0, 1, 1, 1", the data signal DATA input to the data input terminal 325 is inverted and output to the output terminal 135 with the rise delay time t2 and the fall delay time t1+Δt1.

FIG. 23C illustrates the delay characteristic when the control signals D1–D4 are input to the input terminals 321–324 as "1, 0, 1, 1", the data input terminal 325 receives the input of the data signal as "0→1→0", that is, as logic "L"→logic "H"→logic "L", and the N channel MOS transistors 11, 13, and 14 operate as "off→on→off". The sum of the gate widths of the transistors 11, 13, and 14 when the transistors operate is W+4W+8W=13W. Since this sum is smaller by 2W than that of the transistors in case of FIG. 23A, the delay time is longer by 2Δt1 than that of FIG. 23A when the output signal is falling. Therefore, the output terminal 135 outputs the inverted waveform having the fall delay time t1+2Δt delayed from the input signal and the rise delay time t2 delayed from the input signal.

In the same manner, FIG. 23D illustrates the delay characteristic when the input terminals 321–324 are supplied with the control signals D1–D4 as "1, 0, 0, 0", and the data input terminal 325 is supplied with a data signal as "0→1→0", that is, as logic "L"→logic "H"→logic "L", and only the N channel MOS transistor 11 is activated. The sum of the gate width at this time is W, since only the N channel MOS transistor 11 is operating. Since this sum is smaller by 14W than that shown in case of FIG. 23A, the fall delay time becomes longer by 14Δt1 than that of the transistors of FIG. 23A. Therefore, the output terminal 135 outputs the inverted waveform having the fall delay time t1+14Δt1 delayed from the input signal and the rise delay time t2 delayed from the input signal.

In this manner, in the tenth embodiment, it is possible to change the delay time Δt1, by using only the N channel MOS transistors 11–14 having different gate widths W, and P channel MOS transistor 9. Moreover, the variable delay circuit of the present invention is able to adapt to the strict standard for the set-up time and hold time restricted by the rise in operation frequency.

This circuit according to the tenth embodiment has superior operability to that of the eighth embodiment, since the memory 400 is set to control the data only once at the beginning of the circuit operation. Although four stages of the P channel MOS transistors are used in the explanation of the present circuit, the same kind of effect can be obtained in a circuit with more or fewer stages.

What is claimed is:

1. A variable delay circuit for controlling a delay comprising:

a plurality of P channel transistors connected in parallel, each P channel transistor having a source electrode, a drain electrode, and a gate electrode, the gate electrodes having different gate sizes, the source electrodes being connected to a power supply, the drain electrodes being connected to an output terminal of the circuit, and the respective gate electrodes being connected to corresponding P channel control signal input terminals for receiving respective control signals;

a plurality of N channel transistors connected in parallel, each N channel transistor having a source electrode, a drain electrode, and a gate electrode, the gate electrodes having different gate sizes, the source electrodes being connected to ground, the drain electrodes being connected to the output terminal of the circuit, and the respective gate electrodes being connected to corresponding N channel control signal input terminals for receiving respective control signals; and a selector comprising a plurality of first logic elements, each first logic element comprising an OR gate having a first input terminal, a second input terminal, and an output terminal, and a plurality of second logic elements, each second logic element comprising an AND gate having a first input terminal, a second input terminal, and an output terminal, the respective output terminals of the first logic elements being connected to corresponding gate electrodes of the P channel transistors, the respective output terminals of the second logic elements being connected to corresponding gate electrodes of the N channel transistors, the respective first input terminals of the first and second logic elements being connected to corresponding control signal input terminals, the second input terminals of the first and second logic elements being connected to a data input terminal for receiving a data signal, wherein control signals applied to the control signal input terminals control delay of a data signal input to the data input terminal, a delayed signal being output at the output terminal of the circuit.

2. The variable delay circuit according to claim 1 wherein the P channel transistors have different gate widths, and the ratio of the respective gate widths is represented as $m\times 2^0 : m\times 2^1 : m\times 2^2 : m\times 2^3 : \ldots : m\times 2^i$ (where i is a positive integer).

3. The variable delay circuit according to claim 1 wherein the N channel transistors have different gate widths, and the ratio of the respective gate widths is represented as $n\times 2^0 : n\times 2^1 : n\times 2^2 : n\times 2^3 : \ldots : n\times 2^i$ (where i is a positive integer).

4. The variable delay circuit according to claim 1 wherein the P channel transistors and the N channel transistors respectively include a plurality of gate electrodes having constant widths, and the ratio of the respective gate electrode widths is represented as $1 : 2 : 2^2 : 2^3 : \ldots : 2^i$ (where i is a positive integer).

5. The variable delay circuit according to claim 1 including a D flip-flop circuit having a D terminal and a T terminal wherein the output terminal of the circuit is connected to the D terminal of the D flip-flop circuit, and the T terminal of the D flip-flop is connected to a clock signal input terminal for correctly reading a signal input to the D terminal of the D flip-flop circuit in response to a clock signal applied to the clock signal input terminal.

6. A variable delay circuit for controlling a delay comprising:

a plurality of P channel transistors connected in parallel, each P channel transistor having a source electrode, a drain electrode, and a gate electrode, the gate electrodes having different gate sizes, the source electrodes being connected to a power supply, the drain electrodes being connected to an output terminal of the circuit, and the respective gate electrodes being connected to corresponding P channel control signal input terminals for receiving respective control signals;

a plurality of N channel transistors connected in parallel, each N channel transistor having a source electrode, a drain electrode, and a gate electrode, the gate electrodes having different gate sizes, the source electrodes being connected to ground, the drain electrodes being connected to the output terminal of the circuit, and the respective gate electrodes being connected to corresponding N channel control signal input terminals for receiving respective control signals; and a selector comprising a plurality of first logic elements, each first logic element having a first input terminal, a second input terminal, and an output terminal, the respective output terminals of the first logic elements being connected to corresponding gate electrodes of the P channel transistors, and a plurality of second logic elements, each second logic element having a first input terminal, a second input terminal, and an output terminal, the respective output terminals of the second logic elements being connected to corresponding gate electrodes of the N channel transistors, the second input terminals of the first and second logic elements being connected to a data input terminal for receiving a data signal; and a memory circuit comprising a plurality of memory elements, each memory element having a first input terminal, a second input terminal, and an output terminal, the respective first input terminals of the memory elements being connected to corresponding control terminals, the second input terminals of the memory elements being connected to a set signal input terminal for receiving a set signal, the respective output terminals of the memory elements being connected to corresponding first input terminals of the first and second logic elements, wherein the memory elements are set in response to a set signal applied to the set signal input terminal for controlling delay of a data signal input to the data input terminal, a delayed signal being output at the output terminal of the circuit.

7. The variable delay circuit according to claim 6 wherein the P channel transistors have different gate widths, and the ratio of the respective gate widths is represented as $m \times 2^0 : m \times 2^1 : m \times 2^2 : m \times 2^3 : \ldots : m \times 2^i$ (where i is a positive integer).

8. The variable delay circuit according to claim 6 wherein the N channel transistors have different gate widths, and the ratio of the respective gate widths is represented as $n \times 2^0 : n \times 2^1 : n \times 2^2 : n \times 2^3 : \ldots : n \times 2^i$ (where i is a positive integer).

9. The variable delay circuit according to claim 6 wherein the P channel transistors and the N channel transistors respectively include a plurality of gate electrodes having constant widths, and the ratio of the respective gate electrode widths is represented as $1 \times 2 : 2^2 : 2^3 : \ldots : 2^i$ (where i is a positive integer).

10. The variable delay circuit according to claim 6 including a D flip-flop circuit having a D terminal and a T terminal wherein the output terminal of the circuit is connected to the D terminal of the D flip-flop circuit, and the T terminal of the D flip-flop is connected to a clock signal input terminal for correctly reading a signal input to the D terminal of the D flip-flop flop circuit in response to a clock signal applied to the clock signal input terminal.

11. The variable delay circuit according to claim 6 wherein the memory elements comprise D flip-flops.

12. A variable delay circuit for controlling a delay comprising:

a plurality of P channel transistors connected in parallel, each P channel transistor having a source electrode, a drain electrode, and a gate electrode, the gate electrodes having different gate sizes, the source electrodes being connected to a power supply, the drain electrodes being connected to an output terminal of the circuit, and the respective gate electrodes being connected to corresponding control signal input terminals for receiving respective control signals;

an N channel transistor having a source electrode, a drain electrode, and a gate electrode, the source electrode being connected to ground, the drain electrode being connected to the output terminal of the circuit, and the gate electrode being connected to a data input terminal; and a selector comprising a plurality of logic elements, each logic element comprising an OR gate having a first input terminal, a second input terminal, and an output terminal, the respective output terminals of the logic elements being connected to corresponding gate electrodes of the P channel transistors, the respective first input terminals of the logic elements being connected to corresponding control signal input terminals, the second input terminals of the logic elements being connected to the data input terminal for receiving a data signal, wherein control signals applied to the control signal input terminals control delay of a data signal input to the data input terminal, a delay signal being output at the output terminal of the circuit.

13. A variable delay circuit for controlling a delay comprising:

a plurality of P channel transistors connected in parallel, each P channel transistor having a source electrode, a drain electrode, and a gate electrode, the gate electrodes having different gate sizes, the source electrodes being connected to a power supply, the drain electrodes being connected to an output terminal of the circuit, and the respective gate electrodes being connected to corresponding control signal input terminals for receiving respective control signals;

an N channel transistor having a source electrode, a drain electrode, and a gate electrode, the source electrode being connected to ground, the drain electrode being connected to the output terminal of the circuit, and the gate electrode being connected to a data input terminal;

a selector comprising a plurality of logic elements, each logic element having a first input terminal, a second input terminal, and an output terminal, the respective output terminals of the logic elements being connected to corresponding gate electrodes of the P channel transistors, the second input terminals being connected to the data input terminal; and a memory circuit comprising a plurality of memory elements, each memory element having a first input terminal, a second input terminal, and an output terminal, the respective first input terminals being connected to corresponding control signal input terminals, the second input terminals being connected to a set signal input terminal for receiving a set signal, the respective output terminals being connected to corresponding first input terminals of the logic elements, wherein the memory elements are set in response to a set signal applied to the set signal input terminal for controlling delay of a data signal input to the data input terminal, a delayed signal being output at the output terminal of the circuit.

14. The variable delay circuit according to claim 13 wherein the memory elements comprise D flip-flops.

15. A variable delay circuit for controlling a delay comprising:

a plurality of N channel transistors connected in parallel, each N channel transistor having a source electrode, a drain electrode, and a gate electrode, the gate electrodes having different gate sizes, the source electrodes being connected to ground, the drain electrodes being connected to an output terminal of the circuit, and the respective gate electrodes being connected to corresponding control signal input terminals for receiving respective control signals;

a P channel transistor having a source electrode, a drain electrode, and a gate electrode, the source electrode being connected to a power supply, the drain electrode being connected to the output terminal of the circuit, and the gate electrode being connected to a data input terminal;

a selector comprising a plurality of logic elements, each logic element comprising an AND gate having a first input terminal, a second input terminal, and an output terminal, the respective output terminals of the logic elements being connected to corresponding gate electrodes of the N channel transistors, the respective first input terminals of the logic elements being connected to corresponding control signal input terminals, the second input terminals of the logic elements being connected to the data input terminal for receiving a data signal, wherein control signals applied to the control signal input terminals control delay of a data signal input to the data input terminal, a delay signal being output at the output terminal of the circuit.

16. A variable delay circuit for controlling a delay comprising:

a plurality of N channel transistors connected in parallel, each N channel transistor having a source electrode, a drain electrode, and a gate electrode, the gate electrodes having different gate sizes, the source electrodes being connected to ground, the drain electrodes being connected to an output terminal of the circuit, and the respective gate electrodes being connected to corresponding control signal input terminals for receiving respective control signals;

a P channel transistor having a source electrode, a drain electrode, and a gate electrode, the source electrode being connected to a power supply, the drain electrode being connected to the output terminal of the circuit, and the gate electrode being connected to a data input terminal;

a selector comprising a plurality of logic elements, each logic element having a first input terminal, a second input terminal, and an output terminal, the respective output terminals of the logic elements being connected to corresponding gate electrodes of the N channel transistors, the second input terminals being connected to the data input terminal; and a memory circuit comprising a plurality of memory elements, each memory element having a first input terminal, a second input terminal, and an output terminal, the respective first input terminals being connected to corresponding control signal input terminals, the second input terminals being connected to a set signal input terminal for receiving a set signal, the respective output terminals being connected to corresponding first input terminals of the logic elements, wherein the memory elements are set in response to a set signal applied to the set signal input terminal for controlling delay of a data signal input to the data input terminal, a delayed signal being output at the output terminal of the circuit.

17. The variable delay circuit according to claim 16 wherein the memory elements comprise D flip-flops.

* * * * *